(12) United States Patent
Maki

(10) Patent No.: US 10,483,443 B2
(45) Date of Patent: Nov. 19, 2019

(54) LIGHT EMITTING DEVICE AND MANUFACTURING METHOD THEREOF

(71) Applicant: TOSHIBA HOKUTO ELECTRONICS CORPORATION, Asahikawa (JP)

(72) Inventor: Keiichi Maki, Asahikawa (JP)

(73) Assignee: Toshiba Hokuto Electronics Corporation, Asahikawa-Shi (JP)

( * ) Notice: Subject to any disclaimer, the term of this patent is extended or adjusted under 35 U.S.C. 154(b) by 0 days.

(21) Appl. No.: 15/078,321

(22) Filed: Mar. 23, 2016

(65) Prior Publication Data
US 2016/0276561 A1    Sep. 22, 2016

Related U.S. Application Data

(63) Continuation of application No. PCT/JP2014/005999, filed on Dec. 1, 2014.

(30) Foreign Application Priority Data

Dec. 2, 2013  (JP) .................................. 2013-249453
Dec. 2, 2013  (JP) .................................. 2013-249454

(51) Int. Cl.
*H01L 33/62*    (2010.01)
*H01L 23/00*    (2006.01)
(Continued)

(52) U.S. Cl.
CPC .............. *H01L 33/62* (2013.01); *H01L 24/81* (2013.01); *H01L 25/0753* (2013.01);
(Continued)

(58) Field of Classification Search
CPC ..... H01L 24/81; H01L 2224/12–17519; H01L 25/0753; H01L 33/62

See application file for complete search history.

(56) References Cited

U.S. PATENT DOCUMENTS

| 7,952,107 B2 | 5/2011 | Daniels et al. |
| 8,044,415 B2 | 10/2011 | Messere et al. |

(Continued)

FOREIGN PATENT DOCUMENTS

| CN | 101297606 A | 10/2008 |
| JP | S60-262430 A | 12/1985 |

(Continued)

OTHER PUBLICATIONS

AZoM. "Gold/Tin Alloys (AU/SN)—Properties and Applications." Feb. 13, 2004. Accessed May 30, 2017 at http://www.azom.com/article.aspx?ArticleID=2371.*

(Continued)

*Primary Examiner* — Zandra V Smith
*Assistant Examiner* — Andre C Stevenson
(74) *Attorney, Agent, or Firm* — Burr & Brown, PLLC

(57) ABSTRACT

A light emitting device includes a first light transmissive supportive substrate having a first light transmissive insulator and a conductive circuitry layer provided on a surface of the first light transmissive insulator, a second light transmissive supportive substrate having a second light transmissive insulator and disposed in such a way that a surface of the second light transmissive insulator faces the conductive circuitry layer and so as to have a predetermined gap from the first light transmissive supportive substrate, a light emitting diode having a main body, and first and second electrodes provided on a surface of the main body and electrically connected to the conductive circuitry layer via a conductive bump, and laid out between the first and second light transmissive supportive substrates, and a third light transmissive insulator embedded in a space between the first light transmissive supportive substrate and the second light transmissive supportive substrate.

34 Claims, 11 Drawing Sheets

(51) Int. Cl.
  *H01L 25/075*  (2006.01)
  *H01L 33/56*   (2010.01)
  *H01L 33/52*   (2010.01)

(52) U.S. Cl.
  CPC .............. *H01L 33/56* (2013.01); *H01L 33/52* (2013.01); *H01L 2224/14* (2013.01); *H01L 2924/00011* (2013.01); *H01L 2924/01322* (2013.01); *H01L 2933/0033* (2013.01); *H01L 2933/0066* (2013.01)

(56) References Cited

U.S. PATENT DOCUMENTS

| | | |
|---|---|---|
| 2005/0127379 A1 | 6/2005 | Nakata |
| 2007/0059646 A1 | 3/2007 | Winscom et al. |
| 2009/0114928 A1 | 5/2009 | Messere et al. |
| 2009/0239318 A1* | 9/2009 | Nakamura .............. H01L 33/54 438/27 |
| 2009/0261357 A1 | 10/2009 | Daniels |
| 2010/0052189 A1* | 3/2010 | Sakurai ................... H01L 24/11 257/778 |
| 2010/0096647 A1 | 4/2010 | Van Herpen et al. |
| 2011/0193105 A1 | 8/2011 | Lerman et al. |
| 2012/0113328 A1 | 5/2012 | Takeshima et al. |
| 2013/0105852 A1 | 5/2013 | Lou |
| 2013/0248916 A1* | 9/2013 | Suehiro ............. H01L 23/49827 257/99 |
| 2013/0285077 A1* | 10/2013 | Kojima .............. H01L 25/0753 257/88 |
| 2014/0362565 A1 | 12/2014 | Yao et al. |
| 2015/0249069 A1* | 9/2015 | Yoshida ................. H01L 33/62 257/89 |

FOREIGN PATENT DOCUMENTS

| | | |
|---|---|---|
| JP | S61-006833 A | 1/1986 |
| JP | S61-194732 A | 8/1986 |
| JP | 07-122787 A1 | 5/1995 |
| JP | H7-122787 | 5/1995 |
| JP | 10-163258 A1 | 6/1998 |
| JP | H11-145381 A | 5/1999 |
| JP | H11-177147 A | 7/1999 |
| JP | 2000-227952 A | 8/2000 |
| JP | 2000-299411 A | 10/2000 |
| JP | 2001-176908 A1 | 6/2001 |
| JP | 2002-246418 A | 8/2002 |
| JP | 2007-081159 A1 | 3/2007 |
| JP | 2007-157895 A1 | 6/2007 |
| JP | 2008-034473 A1 | 2/2008 |
| JP | 2010-525504 A1 | 7/2010 |
| JP | 2011-029634 A1 | 2/2011 |
| JP | 2011-134926 | 7/2011 |
| JP | 2011-134926 A1 | 7/2011 |
| JP | 2011-228463 A | 11/2011 |
| JP | 2011-228463 A1 | 11/2011 |
| JP | 2012-084855 A1 | 4/2012 |
| JP | 5533183 B2 | 6/2014 |

OTHER PUBLICATIONS

International Search Report and Written Opinion (Application No. PCT/JP2014/005999) dated Mar. 10, 2015.
U.S. Appl. No. 15/078,404, filed Mar. 23, 2016, Keiichi Maki.
Chinese Office Action (and translation provided by foreign counsel) from a corresponding Chinese patent application dated Jun. 27, 2017, 23 pages.
Chinese Office Action and Search (and translation provided by foreign counsel) dated May 26, 2017 from a related Chinese patent application (CN 201480048553.2), 19 pages.
International Search Report and Written Opinion (PCT/JP2014/006000) dated Feb. 24, 2015 from a related international patent application, 9 pages.

* cited by examiner

LIGHT EMITTING DEVICE AND MANUFACTURING METHOD THEREOF

CROSS REFERENCE TO RELATED APPLICATIONS

This application is continuation of International Application No. PCT/JP2014/005999, filed on Dec. 1, 2014, which is based upon and claims the benefit of priority from the prior Japanese Patent Applications No. 2013-249453 and No. 2013-249454 filed on Dec. 2, 2013. The entire specifications, claims, and drawings of Japanese Patent Applications No. 2013-249453 and No. 2013-249454 are herein incorporated in this specification by reference.

FIELD

Embodiments of the present disclosure relate to a light emitting device and a manufacturing method thereof.

BACKGROUND

Light emitting devices including Light Emitting Diodes (LEDs) are widely applied to display devices indicator lamps, various switches, signaling devices, and optical devices like general lighting instrument for indoor, outdoor, stationary and moving locations, etc. In such light emitting devices that include LEDs, a light transmissive light emitting device which has a plurality of LEDs laid out between two light transmissive substrates has been known as a device suitable for display devices and indication lamps, etc., that display various character strings, geometric figures and patterns.

By applying a flexible substrate, etc., formed of a light transmissive resin as the light transmissive substrate, a constraint to an attachment plane for the light emitting device as the display device, the indication lamp, etc., is eased. This improves the convenience and applicability of the light transmissive light emitting device.

The light transmissive light emitting device includes, for example, a first light transmissive insulation substrate that has a first conductive circuitry layer, a second light transmissive insulation substrate that has a second conductive circuitry layer, and, a plurality of LED chips laid out therebetween. The plurality of LED chips each includes an electrode pair, and such electrode pair is electrically connected to the respective first and second conductive circuitry layers. A space between the first light transmissive insulation substrate and the second light transmissive insulation substrate produced by the plurality of LED chips laid out with a certain clearance is filled with a light transmissive insulator formed of a light transmissive resin, etc., which has the electrical insulation property and the flexibility. In other words, the LED chips are laid out in a through-hole formed in the light transmissive insulator.

As for the electrical connection between the electrode of the LED chip and the conductive circuitry layer in the above-explained light transmissive light emitting device, for example, thermal compression bonding is typically applied to a laminated body that includes the first light transmissive insulation substrate, the light transmissive insulation resin sheet which has the through-hole in which the LED chips are laid out, and the second light transmissive insulation substrate. In this case, by designing the thickness of the light transmissive insulation resin sheet (thickness of light transmissive insulator) having undergone the thermal compression bonding to be thinner than that of the LED chip, the conductive circuitry layer is depressed against the electrode of the LED chip so as to be in contact therewith. The electrode of the LED chip and the conductive circuitry layer may be bonded by a conductive adhesive. In addition, a technology of providing a hot-melt adhesive sheet that fastens the LED chips between the upper and lower insulation substrates each including the conductive circuitry layer, performing thermal compression bonding thereto to embed the LED chips in the adhesive sheet, thereby simultaneously accomplishing the bonding between the upper and lower insulation substrates and the electrical connection between the electrode of the LED chip and the conductive circuitry layer has been proposed.

In any cases, however, the electrical connection between the conductive circuitry layer and the electrode, and the reliability thereof are not sufficiently ensured. Therefore, there is a need to improve those properties.

DESCRIPTION OF EMBODIMENTS

A light emitting device according to the present disclosure includes:

a first light transmissive supportive substrate that includes a first light transmissive insulator and a conductive circuitry layer provided on a surface of the first light transmissive insulator;

a second light transmissive supportive substrate which includes a second light transmissive insulator, and which is disposed in such a way that a surface of the second light transmissive insulator faces the conductive circuitry layer and so as to have a predetermined gap from the first light transmissive supportive substrate;

a light emitting diode which includes a light emitting diode main body, and first and second electrodes provided on a surface of the light emitting diode main body and electrically connected to the conductive circuitry layer via a conductive bump, and which is laid out between the first light transmissive supportive substrate and the second light transmissive supportive substrate; and a third light transmissive insulator embedded in a space between the first light transmissive supportive substrate and the second light transmissive supportive substrate.

[First Embodiment]

Figure 1:
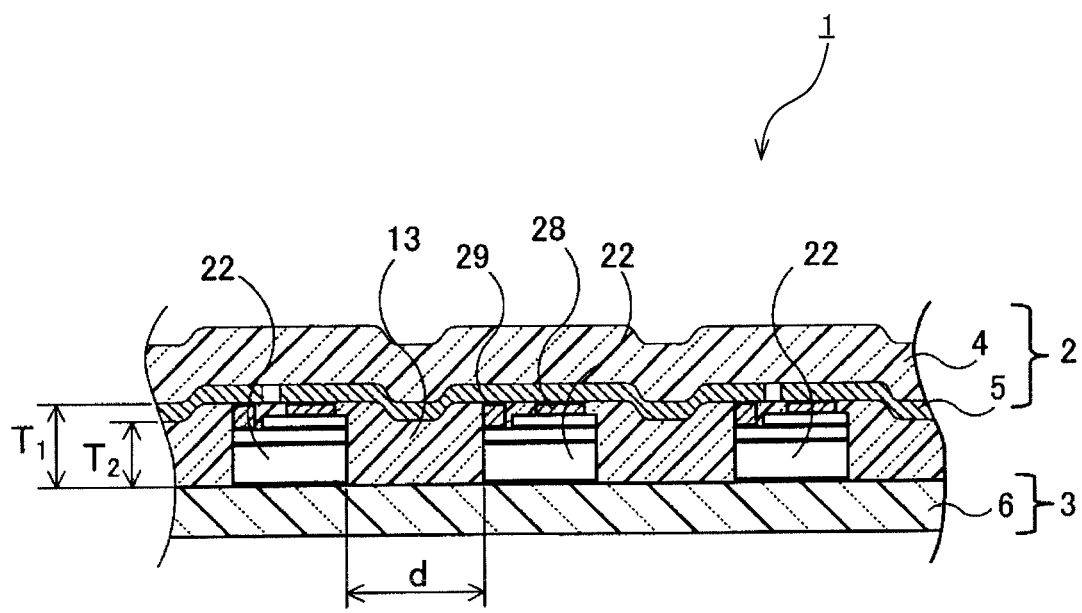
FIG. 1 is an exemplary cross-sectional view illustrating a schematic structure of a light emitting device according to a first embodiment.
Figure 2:
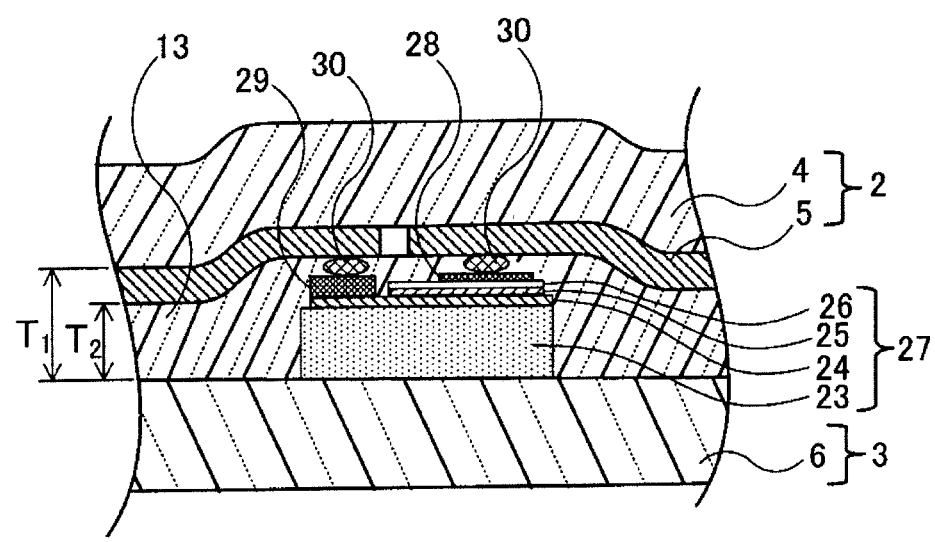
FIG. 2 is a cross-sectional view illustrating a part of the light emitting device in an enlarged manner.

A light emitting device according to a first embodiment of the present disclosure will be explained with reference to the figures. FIG. 1 is an exemplary cross-sectional view illustrating a schematic structure of a light emitting device 1 according to this embodiment. In addition, FIG. 2 is a cross-sectional view illustrating a part of the light emitting device 1 illustrated in FIG. 1 in an enlarged view.

As illustrated in FIG. 1, the light emitting device 1 roughly includes a light transmissive supportive substrate 2, a light transmissive supportive substrate 3, a light emitting diode 22, and a light transmissive insulator 13.

The light transmissive supportive substrate 2 includes a light transmissive insulator 4, and a conductive circuitry layer 5 provided on a surface of the light transmissive insulator 4. The conductive circuitry layer 5 is provided on only the surface of the light transmissive insulator 4 that constructs the light transmissive supportive substrate 2.

The light transmissive supportive substrate 3 includes a light transmissive insulator 6, and is disposed in such a way that a surface of the light transmissive insulator 6 faces the conductive circuitry layer 5 with a predetermined gap. That is, the light transmissive supportive substrate 3 itself has no conductive circuitry layer.

The light emitting diode 22 includes semiconductor layers formed on an insulation substrate or a semiconductor substrate, and includes a light-emitting-diode main body 27, and electrodes 28, 29 which are provided on a surface of the light-emitting-diode main body 27, and which are electrically connected to the conductive circuitry layer 5. The light emitting diode 22 is laid out between the light transmissive supportive substrate 2 and the light transmissive supportive substrate 3. The plurality of light-emitting-diode main bodies 27 are laid out with a predetermined clearance. A minimum distance d between the adjoining light-emitting-diode main bodies 27 is not limited to any particular value, but the present disclosure is particularly suitable for high-density packaging that has the minimum distance d which becomes equal to or smaller than 1500 μm.

In addition, the number of laid-out light-emitting-diode main bodies 27 can be determined as needed in accordance with the specifications of the light emitting device 1 (e.g., external dimension light emitting area).

As illustrated in, for example, FIG. 2, the light emitting diode 22 includes an N-type semiconductor layer (e.g., n-GaN layer) 24, an active layer (e.g., InGaN layer) 25. and a P-type semiconductor layer (e.g., p-GaN layer) 26 formed on an insulation substrate 23 like a light transmissive sapphire substrate in this order. Note that the layout positions of the N-type semiconductor layer and P-type semiconductor layer may be reversed. In this embodiment, a single-sided electrode structure in which the electrodes 28, 29 are provided at the light-emitting-surface side of the light-emitting-diode main body 27 is adopted. In addition, the single-sided electrode structure is applicable to the light emitting diode that has a semiconductor layer formed on a semiconductor substrate.

The electrodes 28, 29 of the light emitting diode 22 are electrically connected to the conductive circuitry layer 5 of the light transmissive supportive substrate 2. The electrodes 28, 29 are each a pad electrode formed of a material that is an alloy containing Au (gold).

As illustrated in FIG. 2, the electrode 28 contacts the conductive circuitry layer 5 via a conductive bump 30, thereby being electrically connected to the conductive circuitry layer 5. The electrode 29 contacts the conductive circuitry layer 5 via the conductive bump 30, thereby being electrically connected to the conductive circuitry layer 5.

Example materials for the conductive bump 30 are gold, an Au—Sn alloy, silver, copper, nickel, an alloy of other metals, a mixture, an eutectic material, an amorphous material, and may be a solder, an eutectic solder, a mixture of metal micro particle with a resin, and an anisotropy conductive film, etc. In addition, the conductive bump 30 may be formed by wire bumping using a wire bonder, electrolytic plating, non-electrolytic plating, inkjet printing and calcining of an ink containing metal micro particle, printing of a paste containing metal micro particle, coating ball mounting, pellet mounting, vapor deposition sputtering, etc.

It is preferable that the melting-point temperature of the conductive bump 30 should be equal to or higher than 180° C., and more preferably, equal to or higher than 200° C. The practical upper limit should be equal to or lower than 1100° C. When the melting-point temperature of the conductive bump 30 is lower than 180° C., in a vacuum thermal pressing process in the manufacturing process of the light emitting device, the conductive bump 30 largely becomes out of shape, and thus the sufficient thickness is not ensured or the bump spreads beyond the electrode, thereby decreasing the light intensity of the LED, etc.

The melting-point temperature of the conductive bump 30 is, for example, a melting-point temperature value measured using a sample of substantially 10 mg at a temperature rise rate of 5° C./min using a DSC-60 differential scanning calorimeter made by SHIMADZU Corporation, and when a solidus temperature and a liquidus temperature differ from each other, is a value of the solidus temperature.

A dynamic hardness DHV of the conductive bump 30 is equal to or larger than 3 and equal to or smaller than 150, and preferably, equal to or larger than 5 and equal to or smaller than 100, and more preferably, equal to or larger than 5 and equal to or smaller than 50. When the dynamic hardness DHV of the conductive bump 30 is less than 3, in a vacuum thermal pressing process in the manufacturing process of the light emitting device, the conductive bump 30 largely becomes out of shape, and thus the sufficient thickness is not ensured. In addition, the bump spreads beyond the electrode, thereby decreasing the light intensity of the LED, etc. Conversely, when the dynamic hardness DHV of the conductive bump 30 exceeds 150, in a vacuum thermal pressing process in the manufacturing process of the light emitting device, the conductive bump 30 deforms the light transmissive supportive substrate 2, resulting in a poor visual inspection result and a poor connection, which is not suitable.

The dynamic hardness DHV of the conductive bump 30 is obtained by, for example, a test at a temperature of 20° C. using a SHIMADZU dynamic ultrafine hardness gauge made by SHIMADZU Corporation. In such a test, a diamond square pyramid indenter (Vickers indenter) with an angle between opposite surfaces that is 136 degrees is pushed in the conductive bump 30 at a load speed of 0.0948 mN/sec. Next, a test force (P/mN) when the push-in depth of the indenter reaches 0.5 μm is substituted in the following formula.

$$DHV=3.8584P/D2=15.4336P$$

It is preferable that the height of the conductive bump 30 should be equal to or larger than 5 μm and equal to or smaller than 50 μm, and more preferably, equal to or larger than 10 μm and equal to or smaller than 30 μm. When the height of the conductive bump 30 is less than 5 μm, a short-circuit prevention effect between the conductive circuitry layer and the P-type semiconductor layer or between the conductive circuitry layer and the N-type semiconductor layer becomes insufficient, which is not suitable. Conversely, when the height exceeds 50 μm, in a vacuum thermal pressing process in the manufacturing process of the light emitting device, the conductive bump 30 deforms the light transmissive supportive substrate 2, resulting in a poor visual inspection result and a poor connection, which is not suitable.

In addition, it is preferable that a contact area between the electrode of the light-emitting-diode main body 27 and the conductive bump 30 should be equal to or larger than 100 μm$^2$ and equal to or smaller than 15000 μm$^2$, more specifically, equal to or larger than 400 μm$^2$ and equal to or smaller than 8000 μm$^2$. Each dimension is a measured value under a stable environment in which a room temperature and the temperature of a measurement object are 20° C.±2° C.

According to the light emitting device of this embodiment, the electrodes 28, 29 of the light-emitting-diode main body 27 and the conductive circuitry layer 5 of the light transmissive supportive substrate 2 are connected by vacuum thermal pressing using the conductive bump 30. Hence, at the time of vacuum thermal pressing, the conductive bump 30 is electrically connected to the electrode of the light emitting diode 22 with a part of such a bump not being melted. Accordingly, it is preferable that a contact angle between the electrode surface of the light-emitting-diode main body 27 and the conductive bump 30 should be equal to or smaller than, for example, 135 degrees.

The light emitting diode 22 emits light by a DC voltage applied via the electrodes 28, 29. When, for example, the light emitting device 1 includes the seven light-emitting-diode main bodies 27 in two rows, the conductive circuitry layer 5 of the light emitting device 1 constructs a 7-series and 2-parallel circuit. The series connection equalizes the flowing current throughout the all light-emitting-diode main bodies 27.

The light transmissive insulator 13 is embedded between the light transmissive supportive substrate 2 and the light transmissive supportive substrate 3.

For the light transmissive insulator 4 and the light transmissive insulator 6, in order to make the light transmissive supportive substrate 2 and the light transmissive supportive substrate 3 flexible, for example, a resin sheet material that has the insulation property, the light transmissive property and the flexibility is applied. Example resin materials are polyethylene terephthalate (PET), a polyethylene naphthalate (PEN), polycarbonate (PC), polyethylene succinate (PES), a cyclic olefin resin (e.g., ARTON (product name) available from JSR Corporation), and an acrylic resin.

It is preferable that the total light transmissivity of the light transmissive insulators 4, 6 should be equal to or higher than 90%, and more preferably, equal to or higher than 95%. Note that the total light transmissivity is defined in, for example, JIS K7105.

It is preferable that the thickness of the light transmissive insulator 4 and that of the light transmissive insulator 6 should be within a range between, for example, 50 to 300 μm. When the thickness of the light transmissive insulator 4 and that of the light transmissive insulator 6 exceed 300 μm, it becomes difficult to give an excellent flexibility to the light transmissive supportive substrate 2 and to the light transmissive supportive substrate 3, possibly decreasing the light transmissive property. Conversely, when the thickness of the light transmissive insulator 4 and that of the light transmissive insulator 6 are less than 50 μm, at the time of vacuum thermal compression bonding, the light transmissive insulator 4 and the light transmissive insulator 6 become out of shape around the light emitting diode 22, which is not suitable.

The conductive circuitry layer 5 is formed of a transparent conductive material, such as indium tin oxide (ITO), fluorine-doped tin oxide (FTO), zinc oxide, or indium zinc oxide (IZO). The conductive circuitry layer 5 can be formed by, for example, forming a thin film by sputtering or electron beam vapor deposition, and patterning the obtained thin film by laser processing or etching, etc.

In addition, the conductive circuitry layer 5 may be formed by, for example, applying a mixture of micro particle of the transparent conductive material that has an average grain size within a range between 10 to 300 nm with a transparent resin binder in a circuit shape by screen printing, etc., or by a patterning process performed on the applied film of the above mixture by laser processing or photolithography to form a circuit.

The conductive circuitry layer 5 is not limited to the transparent conductive material, but may be formed by applying micro particle of a non-transparent conductive material, such as gold or silver, in a mesh shape. For example, after a photosensitive compound of a non-transparent conductive material like silver halide is applied, exposure and development processes are performed to form the conductive circuitry layer 5 in a mesh shape. In addition, a slurry containing micro particle of the non-transparent conductive material may be applied in a mesh shape by screen printing, etc., to form the conductive circuitry layer 5.

It is sufficient if the conductive circuitry layer 5 shows the light transmissive property when formed on the surface of the light transmissive insulator 4 to obtain the light transmissive supportive substrate 2.

It is preferable that the conductive circuitry layer 5 should have the light transmissive property in such a way that the total light transmissivity (JIS K7105) of the light transmissive supportive substrate 2 becomes equal to or higher than 10% and the total light transmissivity as a whole light emitting device 1 becomes equal to or higher than 1%. When the total light transmissivity as a whole light emitting device 1 is lower than 1%, a light emitting dot is unrecognizable as a bright point. It is preferable that, depending on the structure of the conductive circuitry layer 5, the conductive circuitry layer 5 itself should have the light transmissive property within a range between 10 to 85%

The light transmissive insulator 13 is embedded in a space between the light transmissive supportive substrate 2 and the light transmissive supportive substrate 3, i.e., a space except a part where the plurality of light emitting diodes 22 is laid out. It is preferable that the light transmissive insulator 13 should be formed of a material containing elastomer as a major element, and may contain other resin components as needed. Example known elastomers are acrylic-based elastomer, olefin-based elastomer, styrene-based elastomer, ester-based elastomer, and urethane-based elastomer. Among those elastomers, the acrylic-based elastomer that satisfies the above-explained characteristics is a suitable material for the light transmissive insulator 13 since such elastomer has, in addition to the light transmissive property, the electrical insulation property, and the flexibility, excellent fluidity when soften, adhesion property after cured, and weather resistance, etc.

It is preferable that the light transmissive insulator 13 should be formed of a light transmissive insulation resin, in particular, elastomer that satisfies predetermined characteristics, such as a Vicat softening temperature, a tensile storage elastic modulus, a glass transition temperature, and a melting-point temperature. For example, it is preferable that with the Vicat softening temperature being within a range between 80 to 160° C., the tensile storage elastic modulus between 0 to 100° C. should be within a range between 0.01 to 10 GPa. In addition, it is preferable that the light transmissive insulator 13 should not be melted at the Vicat softening temperature, and have the tensile storage elastic modulus of equal to or higher than 0.1 Mpa at the Vicat softening temperature.

It is preferable that the light transmissive insulator 13 should have a melting-point temperature of equal to or higher than 180° C. or a melting-point temperature higher than the Vicat softening temperature by equal to or higher than 40° C. In addition, it is preferable that the light transmissive insulator 13 should have a glass transition temperature of equal to or lower than −20° C. Note that the Vicat softening temperature is a value obtained under the A 50 condition described in JIS K7206 (ISO 306: 2004) at the test load of 10 N and a temperature rise rate of 50° C./hour.

The glass transition temperature and the melting-point temperature are values obtained through a heat flux differential scanning calorimetry at a temperature rise rate of 5° C./min using a differential scanning calorimeter in accordance with a scheme conforming to JIS K7121 (ISO 3146). The tensile storage elastic modulus is a value obtained at a frequency of 10 Hz using a dynamic viscosity automated measuring instrument by rising a temperature from −100° C. to 200° C. at a temperature rise equal rate of 1° C./min conforming to JIS K7244-1 (ISO 6721).

The light transmissive insulator 13 can be disposed up to the peripheries of the electrodes 28, 29. That is, when the electrodes 28, 29 each have a smaller area than that of the electrode formation surface (e.g., light emitting surface) of the light-emitting-diode main body 27, and are in a shape protruding from the electrode formation surface, with the electrodes 28, 29 being in contact with the conductive circuitry layer 5, a space is formed between a part (a part where no electrode 28, 29 is formed) of the electrode formation surface where no electrode 28, 29 is formed and the conductive circuitry layer 5. It is preferable to fill the light transmissive insulator 13 in such a tiny space between the part where no electrode 28, 29 is formed and the conductive circuitry layer 5.

The light transmissive insulator 13 has a thinner thickness than a height T1 of the light emitting diode 22 in order to improve the contact characteristic between the conductive circuitry layer 5 and the electrodes 28, 29. The light transmissive supportive substrate 2 intimately in contact with the light transmissive insulator 13 is formed in a curved shape inwardly from a part where the light emitting diode 22 is laid out and toward the middle portion between the adjoining light emitting diodes 22. Hence, the light transmissive supportive substrate 2 pushes the conductive circuitry layer 5 against the electrodes 28, 29. Accordingly, the electrical connection between the conductive circuitry layer 5 and the electrodes 28, 29, and the reliability thereof can be improved.

Figure 3:
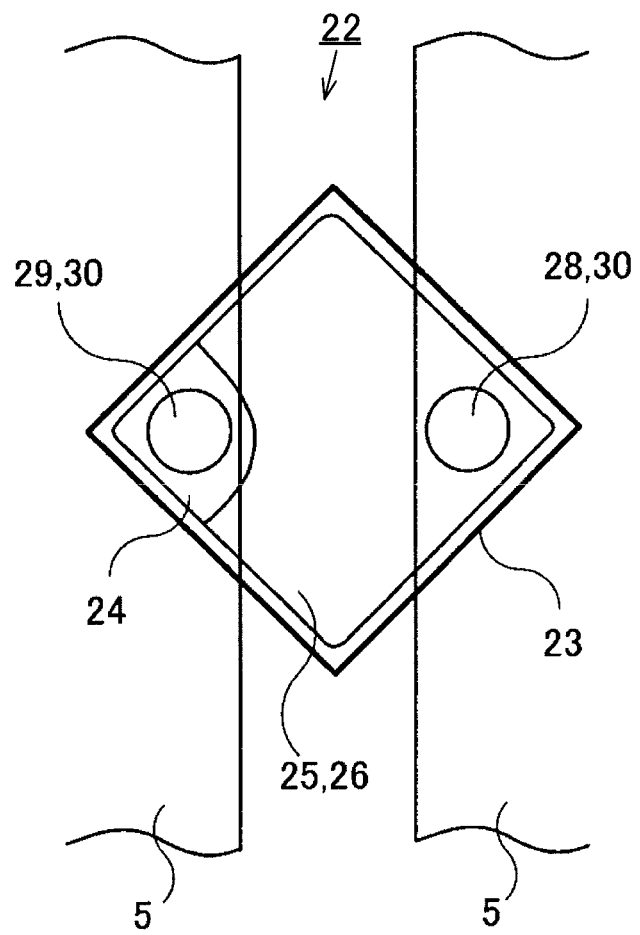
FIG. 3 is a plan view for explaining an example connection according to an embodiment.

The electrode 29 provided on the light emitting surface of the light-emitting-diode main body 27 has a smaller area than that of the light emitting surface so as not to disturb light emission from the active layer 25 to the external space. FIG. 3 illustrates an example connection between the conductive circuitry layer 5 and the light emitting diode 22 according to this embodiment. The light emitting diode 22 is connected to the conductive circuitry layer 5. The conductive circuitry layer 5 is formed of, for example, a light transmissive conductive material, but as explained above, the material thereof is not limited to this example. In addition, the pattern of the conductive circuitry layer 5 is not limited to this example, and various changes can be made thereto.

According to this embodiment, in the flexible light transmissive light emitting device that has embedded light emitting diodes, even if, for example, the pad electrode is flexed in a concave shape, the conductive bump 30 ensures a sufficient height, and thus a short-circuit can be prevented.

[Manufacturing Method]

FIGS. 4A to 4D are diagrams for explaining a manufacturing method of the light emitting device according to this embodiment. The manufacturing method of the light emitting device according to this embodiment will be explained with reference to FIGS. 4A to 4D.

First, the light emitting diode 22 that has the electrode 28 and the electrode 29 (anode electrode and cathode electrode or cathode electrode and anode electrode) already formed is prepared.

Next, the conductive bumps 30 are respectively formed on the electrodes 28, 29 of the light emitting diode 22. As for the method of forming the conductive bump 30, a method of forming a gold or gold alloy bump from an Au wire or an Au alloy wire using a wire bump forming machine is applicable. It is preferable that the applied wire should have a diameter of equal to or larger than 15 μm and equal to or smaller than 75 μm.

In this embodiment, a wire bonding apparatus is applied, discharging is performed on the wire tip to melt the metal and to form a ball. Next, ultrasound is applied to connect such a ball to the pad electrode. Subsequently, with the ball being connected to the pad electrode, the wire is cut out from the ball.

[Rounding Process]

A tiny protruding burr left on the top of the ball may be left as it is, but a rounding process of depressing the upper surface of the ball to round the upper surface thereof may be performed when desirable. In the latter case, a tamping process may be performed by a presser using a resin sheet, but the upper surface of the ball may be pressed by the tip of a jig of the wire bonding apparatus. When the depressing-type rounding process is performed, the curvature factor of the upper surface of the ball becomes slightly larger than that of the lower portion of the ball.

Figure 5:
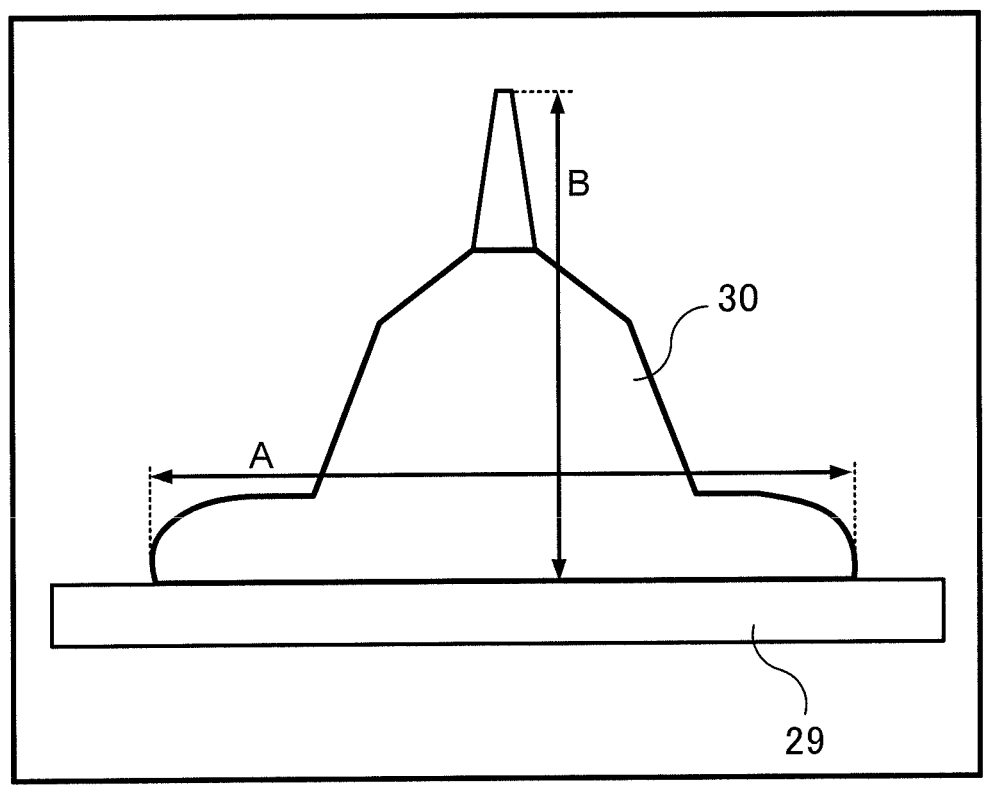
FIG. 5 is an exemplary diagram for a bump (ball) shape prior to a rounding process.

FIG. 5 is an exemplary diagram illustrating a shape of a bump (ball) before the rounding process. As illustrated in FIG. 5, the conductive bump 30 has a remaining wire cut out when the bump is formed. This remaining wire is called a tail. When the diameter of a surface in contact with the pad electrode of the LED is A and the height of the bump is B, it is desirable that the conducive bump 30 should have a shape which satisfies a condition B/A=0.2 to 0.7. Hence, as for the tail that is out of this numerical range, the rounding process is performed.

Figure 6A:
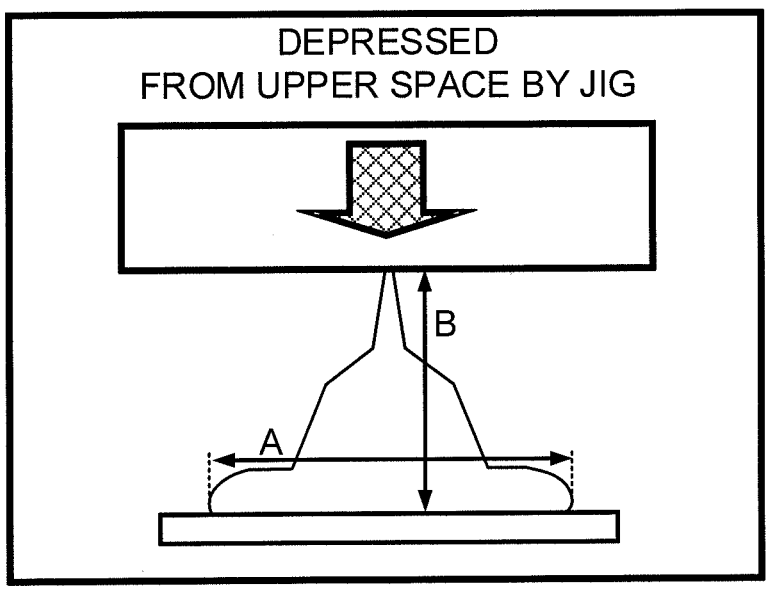
FIG. 6A is a diagram for explaining the rounding process using a jig.
Figure 6B:
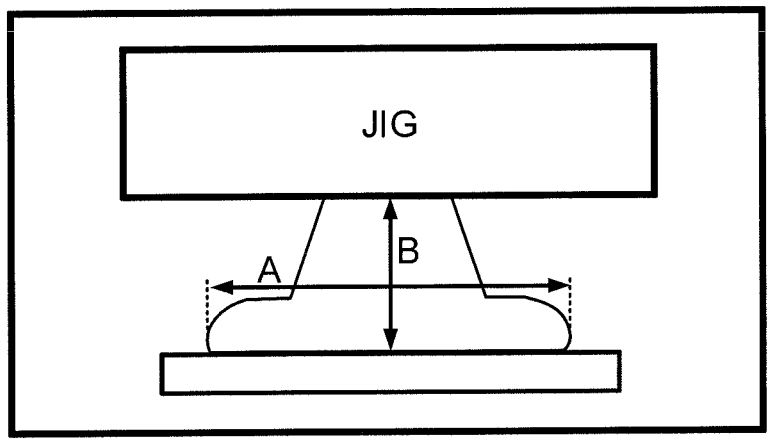
FIG. 6B is a diagram for explaining the rounding process using a jig.
Figure 6C:
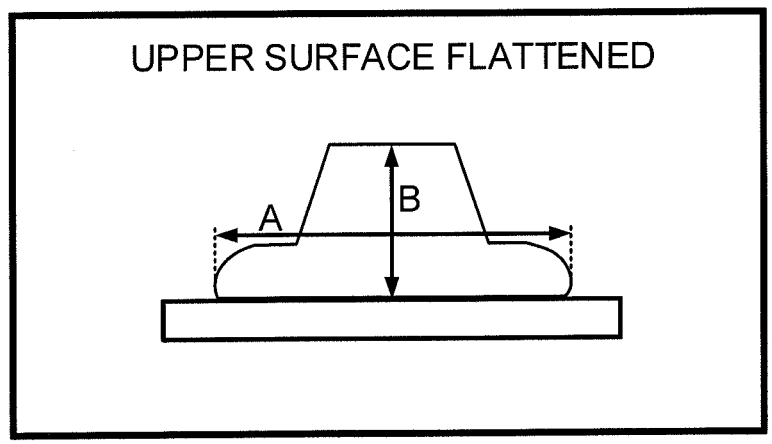
FIG. 6C is a diagram for explaining the rounding process using a jig.

FIGS. 6A to 6C are diagrams for explaining the rounding process using a jig. After a bump is formed, the light emitting diode is placed (see FIG. 6A) on the stage of a bump bonding apparatus (unillustrated). A jig attached to the bump bonding apparatus and harder than the bump is depressed against the upper portion of the bump with the lower surface of the jig being in parallel with the electrode (see FIG. 6B). At this time, the jig is continuously depressed until the height of the bump becomes the desired height B. Consequently, the wire left at the upper portion when the wire is cut out at the time of bump formation is crushed (see FIG. 6C), and thus a continuous surface that has no protrusion is formed on the bump.

Figure 7A:
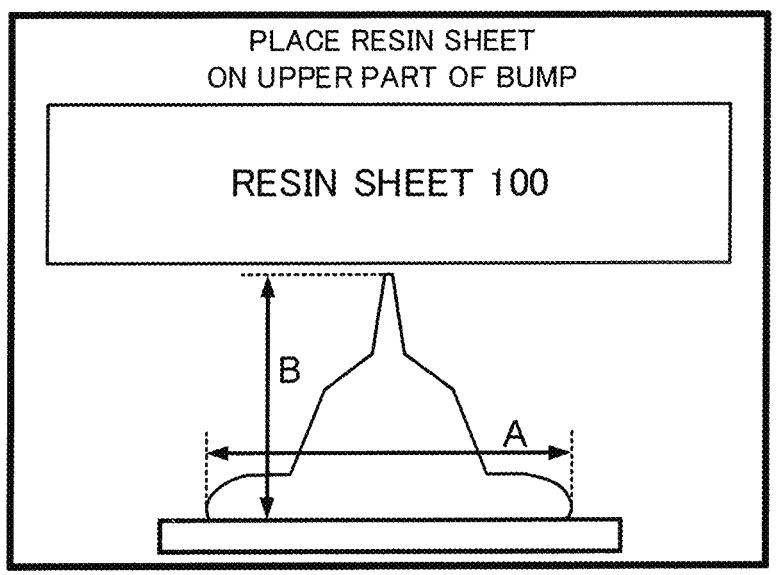
FIG. 7A is a diagram for explaining a rounding process by a press work applied to a resin sheet.
Figure 7B:
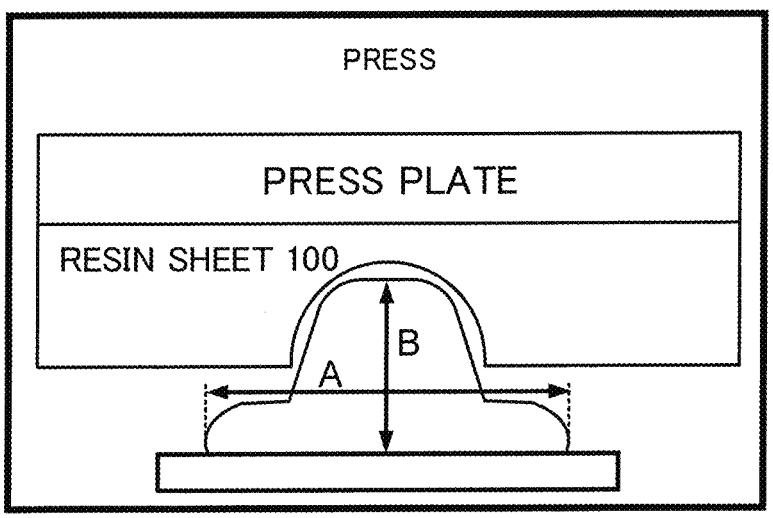
FIG. 7B is a diagram for explaining the rounding process by a press work applied to a resin sheet.
Figure 7C:
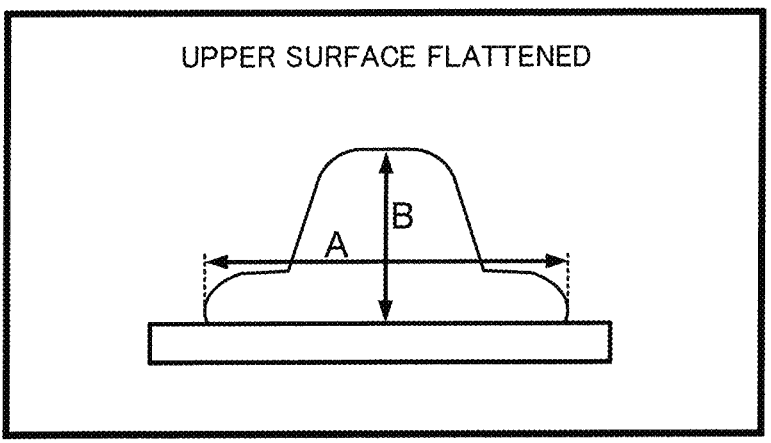
FIG. 7C is a diagram for explaining the rounding process by a press work applied to a resin sheet.
Figure 8A:
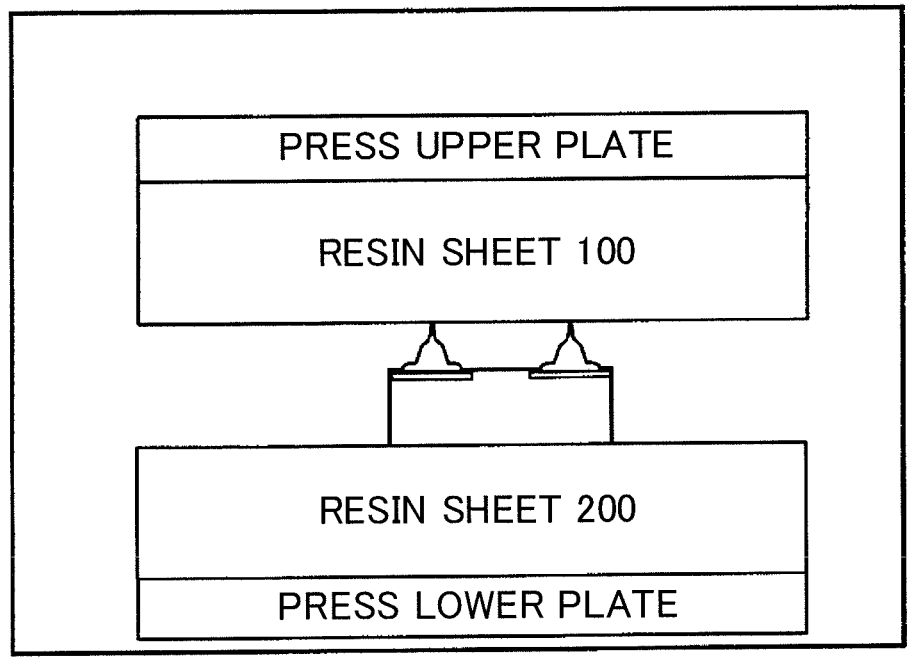
FIG. 8A is a diagram for explaining a layout of LED chips before and after a press work.
Figure 8B:
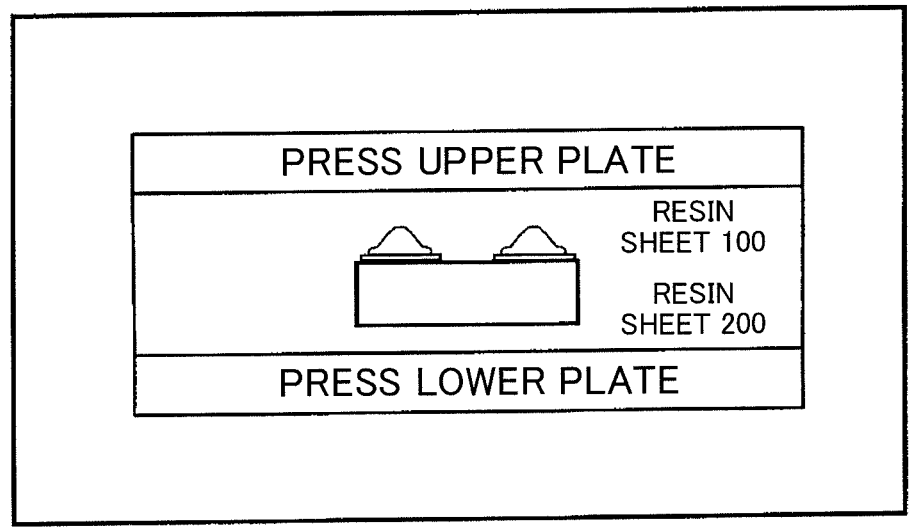
FIG. 8B is a diagram for explaining a layout of LED chips before and after a press work.

FIGS. 7A to 7C are diagrams for explaining the rounding process by a press work using a resin sheet. FIG. 8A is a diagram illustrating a layout of the light emitting diodes prior to a press work. FIG. 8B is a diagram for explaining the layout of the LED chips after the press work. A resin sheet 200 that is thicker than a height obtained by adding the height B of the formed bump with the thickness of the LED chip is placed on the lower plate of a pressing apparatus, the LED chips formed with bumps are placed on the resin sheet 200, and a resin sheet 100 that is thicker than a height obtained by adding the height B of the formed bump with the thickness Of the LED chip is placed on the LED chips (see FIG. 7A). In this case, example materials for the resin sheets 100, 200 are such as PET, a fluorine resin, TPX, and olefin.

As illustrated in FIG. 8A, when pressure is applied so as to hold the light emitting diodes between the press upper plate of the pressing apparatus and the press lower plate thereof to perform pressing (see FIG. 7B), as illustrated in FIG. 8B, the bump formation surface of the light emitting diode is embedded in the resin sheet 100. In addition, the opposite surface of the LED chip to the bump formation surface is embedded in the resin sheet 200.

After the press work as illustrated in FIG. 8B, the resin sheets 100, 200 are peeled off. Consequently, the wire portion of the bump formed on the LED chip and left on the upper portion of the bump when the wire is cut at the time of bump formation has been crushed by the resin sheet 100, and thus a continuous surface is formed on the upper portion of the bump (see FIG. 7C). At this time, by adjusting the resin hardness and the pressing force, the bump height B can be adjusted. Note that the LED chip may be directly disposed on the press lower plate without the resin sheet 200 being disposed at the time of pressing.

In the case of the press work scheme using the resin sheet, in comparison with the rounding method using the jig, the continuous surface formed on the upper portion of the bump becomes a rounded surface. Hence, although the conductive bump is formed on the pad electrode using a metal ball, in addition to the wire bump, electrolytic plating, non-electrolytic plating, inkjet application using an ink that contains metal micro particle, application or printing of a paste that contains metal micro particle, thermal compression bonding of a ball mounting and pellet mounting anisotropy conductive film, etc., enable application of metal, such as gold, silver, copper, or nickel, an alloy like a gold-tin alloy, eutectic, amorphous and a solder.

Next, the light transmissive supportive substrate 2 that includes the light transmissive insulator 4 and the conductive circuitry layer 5 formed on the surface of the light transmissive insulator 4, and, the light transmissive supportive substrate 3 that includes the light transmissive insulator 6 only are prepared. The material of the conductive circuitry layer 5 and the formation method thereof, etc., are as explained above.

Next, the light transmissive insulation resin sheet 13' that has a Vicat softening temperature within a range between 80 to 160° C. is prepared. In addition to the above-explained Vicat softening temperature, it is preferable that the light transmissive insulation resin sheet 13' should contain a resin that is a major element which does not melt at the Vical softening temperature with the tensile storage elastic modulus being within a range between 0.01 and 10 GPa within a temperature range between 0 to 100° C., has the tensile storage elastic modulus of equal to or higher than 0.1 MPa at the Vicat softening temperature, has the melting-point temperature of equal to or higher than 180° C. or higher than the Vicat softening temperature by equal to or higher than 40° C., and has the glass transition temperature of equal to or lower than −20° C. It is preferable that the light transmissive insulation resin sheet 13' should be formed of an elastomer sheet, and more preferably, an acrylic-based elastomer sheet.

Figure 4A:
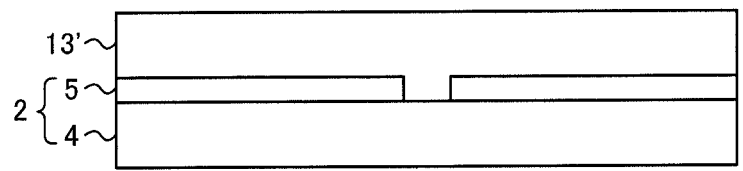
FIG. 4A is a diagram for explaining a manufacturing method of the light emitting device according to the first embodiment.

Next, the light transmissive insulation resin sheet 13' is disposed on the conductive circuitry layer 5 of the light transmissive supportive substrate 2 so as to cover the entire conductive circuitry layer 5 (see FIG. 4A). For example, the light transmissive insulation resin sheet 13' is tentatively attached by an adhesive.

The light transmissive insulation resin sheet 13' is formed in a shape that is capable of covering the whole conductive circuitry layer 5 and the whole light transmissive insulator 4 including the portion where the light emitting diode 22 is to be disposed on the conducive circuitry layer 5. The plurality of light emitting diodes 22 is disposed on the light transmissive insulation resin sheet 13' (see FIG. 4B). The light emitting diodes 22 are disposed in such a way that the electrodes 28, 29 are located at the light-transmissive-insulation-resin-sheet-13' side, i.e., at the conductive-circuitry-layer-5 side. The light transmissive supportive substrate 3 is disposed on the light emitting diodes 22 (see FIG. 4C).

Figure 4B:
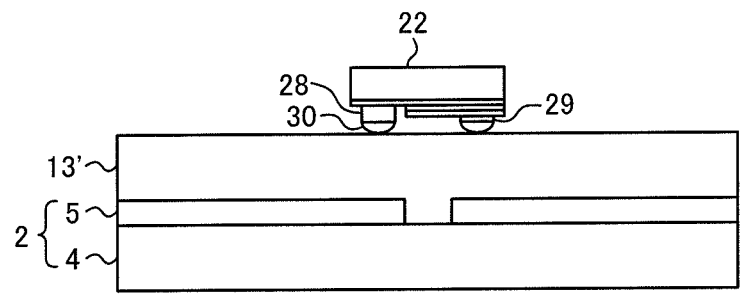
FIG. 4B is a diagram for explaining a manufacturing method of the light emitting device according to the first embodiment.
Figure 4C:
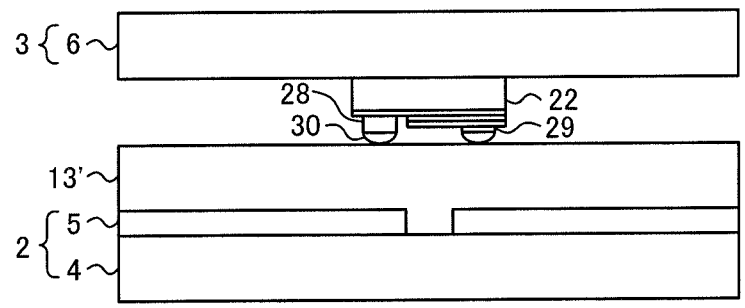
FIG. 4C is a diagram for explaining a manufacturing method of the light emitting device according to the first embodiment.

By executing the processes illustrated in FIG. 4A to FIG. 4C, with the electrodes 28, 29 being located at the conductive-circuitry-layer-5 side, the light emitting diode 22 is laid out between the light transmissive supportive substrate 2 and the light transmissive supportive substrate 3.

It is appropriate if the light transmissive insulation resin sheet 13' has a thickness capable of sufficiently filling a space between the light transmissive supportive substrate 2 and the light transmissive supportive substrate 3 in a vacuum thermal compression bonding process to be explained later, i.e., a space based on the gap between the light transmissive supportive substrate 2 and the light transmissive supportive substrate 3 produced by the laid-out light emitting diodes 22.

More specifically, it is appropriate if the thickness of the light transmissive insulation resin sheet 13' is capable of sufficiently filling a gap between the light transmissive supportive substrate 2 and the light transmissive supportive substrate 3 based on the height of the light emitting diode 22. When a thickness (T) of the light transmissive insulator 13 is designed so as to be thinner than the height (H) of the light emitting diode 22, it is appropriate to design the thickness of the light transmissive insulation resin sheet 13' in accordance with a difference (H-T).

Figure 4D:
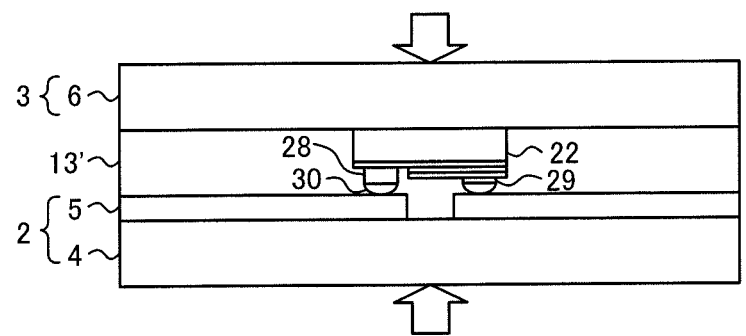
FIG. 4D is a diagram for explaining a manufacturing method of the light emitting device according to the first embodiment.

Next, as illustrated in FIG. 4D, a laminated body that includes the light transmissive supportive substrate 2, the light transmissive insulation resin sheet 13', the light emitting diodes 22, and the light transmissive supportive substrate 3 laminated in this order is pressurized under a vacuum condition while being heated.

As for the heating and pressurizing process (vacuum thermal compression bonding process) for the laminated body under the vacuum condition, it is preferable that heating and pressurizing are performed on the laminated body up to a temperature T within a range Mp−10 (° C.)≤T≤Mp+30 (° C.) where Mp is the Vicat softening temperature (° C.) of the light transmissive insulation resin sheet 13'. A more preferable heating temperature is within a range Mp−10 (° C.)≤T≤Mp+10 (° C.).

By applying such a heating condition, it becomes possible to pressurize the laminated body with the light transmissive insulation resin sheet 13' being softened appropriately. The electrodes 28, 29 disposed on the conductive circuitry layer 5 via the light transmissive insulation resin sheet 13' are connected to the predetermined portions of the conductive circuitry layer 5, and the softened light transmissive insulation resin sheet 13' is embedded between the light transmissive supportive substrate 2 and the light transmissive supportive substrate 3, thereby forming the light transmissive insulator 13.

When a heating temperature T of the laminated body at the time of vacuum thermal compression bonding is lower than a temperature (T<Mp−10) that is lower than the Vicat softening temperature Mp of the light transmissive insulation resin sheet 13' by 10 (° C.), the softening of the light transmissive insulation resin sheet 13' becomes insufficient, resulting in a possibility that the adhesion of the light transmissive insulation resin sheet 13' (and thus light transmissive insulator 13) to the light emitting diode 22 decreases. When the heating temperature T of the laminated body exceeds a temperature (Mp+30<T) that is higher than the Vicat softening temperature Mp of the light transmissive insulation resin sheet 13' by 30 (° C.), the light transmissive insulation resin sheet 13' becomes too soft, possibly causing a defective shape.

<Thermal Compression Bonding Process>

It is preferable that the thermal compression bonding process for the laminated body in the vacuum condition should be carried out as follow. The above-explained laminated body is pre-pressurized to cause respective components intimately in contact with each other. Next, air in a work space where the pre-pressurized laminated body is disposed is drawn to accomplish the vacuum condition, and pressurization is performed while the laminated body is heated to the above-explained temperature. By performing thermal compression bonding on the pre-pressurized laminated body under the vacuum condition in this way, the softened light transmissive insulation resin sheet 13' can be filled in the space between the light transmissive supportive substrate 2 and the light transmissive supportive substrate 3 without any void.

It is preferable that the vacuum condition at the time of thermal compression bonding should be equal to or lower than 5 kPa. The pre-pressurizing process may be omitted, but in this case, misalignment, etc., is likely to occur in the laminated body, and thus execution of the pre-pressurizing process is preferable.

When the thermal compression bonding process for the laminated body is performed under an atmospheric condition or a low vacuum condition, air bubbles are likely to be left in the light emitting device 1 having undergone the thermal compression bonding, in particular, around the light emitting diode 22. Since the air bubbles left in the light emitting device 1 are pressurized, this may cause an expansion of the light emitting device 1 having undergone the thermal compression bonding or a peeling of the light emitting diode 22 from the light transmissive supportive substrate 2 and the light transmissive supportive substrate 3. In addition, when the air bubbles and expansion are present in the light emitting device 1, in particular, near the light emitting diode 22, light will be scattered non-uniformly, which is not preferable since it becomes a problem in the visual inspection of the light emitting device 1.

With the light transmissive insulation resin sheet 13' being present between the conductive circuitry layer 5 and the electrodes 28, 29 of the light emitting diode 22, by performing the vacuum thermal compression bonding, the electrodes 28, 29 can be electrically connected to the conductive circuitry layer 5, while at the same time, the light transmissive insulator 13 intimately in contact with the periphery of the light emitting diode 22 can be formed. In addition, a part of the light transmissive insulator 13 can be filled excellently in the space between the part of the light emitting surface of the light-emitting-diode main body 27 where no electrode 28, 29 is formed and the conductive circuitry layer 5.

According to the manufacturing method in this embodiment, the light emitting device 1 which has the improved electrical connection between the conductive circuitry layer 5 and the electrodes 28, 29 of the light emitting diode 22 and the enhanced reliability thereof can be manufactured with an excellent reproducibility.

Figure 13:
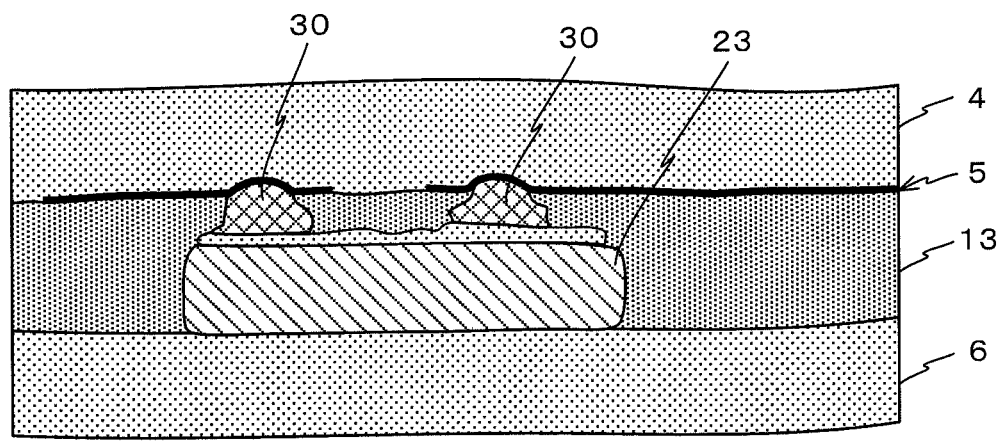
FIG. 13 is a diagram illustrating a light emitting diode, a light transmissive insulator, a conductive circuitry layer, and a light transmissive insulation substrate located around the light emitting diode.
Figure 14:
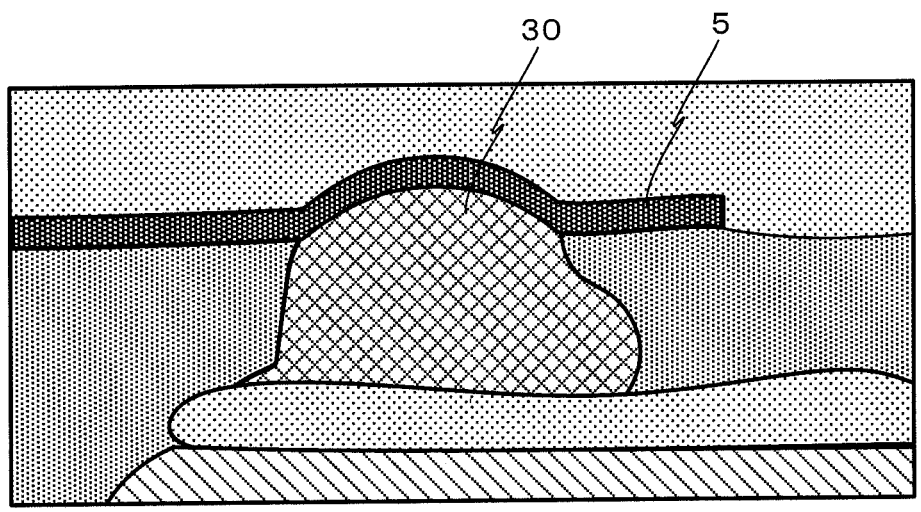
FIG. 14 is a diagram illustrating a conductive bump formed on an electrode of a light emitting diode in an enlarged manner.

FIG. 13 is a diagram illustrating the light emitting diode 22 constructing the light emitting device 1, and the light transmissive insulator 13, the conductive circuitry layer 5, and, the light transmissive insulators 4, 6 located around the light emitting diode 22. In addition, FIG. 14 is a diagram illustrating the conductive bumps 30 formed on the electrodes 28, 29 of the light emitting diode 22 in an enlarged manner. As is clear from FIGS. 13 and 14, according to the light emitting device 1, the conductive circuitry layer 5 has a contact area with the conductive bump 30 of the light emitting diode 22 concaved along the conductive bump 30.

Hence, the contact area between the conductive bump 30 and the conductive circuitry layer 5 can be increased. Consequently, a resistance between the conductive bump 30 and the conductive circuitry layer 5 can be reduced.

In this embodiment, although the explanation has been given of an example case in which the light transmissive insulator 13 is formed of a single-layer sheet, the light transmissive insulator 13 may be formed of two light transmissive insulation resin sheets, and with the light emitting diode being held between the two light transmissive insulation resin sheets, pressurization may be applied to the light transmissive supportive substrate 2 and the light transmissive supportive substrate 3 to obtain the structure illustrated in FIG. 2.

In addition, at this time, the light transmissive supportive substrate 3 may be utilized as a tentative base, and the whole structure may be pressurized to accomplish an electrical connection between the electrodes 28, 29 and the conductive circuitry layer 5. Subsequently, either one of the two light transmissive resin sheets at the opposite side to the electrodes 28, 29 may be peeled, and the light transmissive resin sheet that has the same thickness as that of the peeled sheet and the eventual light transmissive supportive substrate 3 may be laid over to accomplish the structure illustrated in FIG. 2.

[Second Embodiment]

Next, an explanation will be given of a light emitting device according to a second embodiment of the present disclosure with reference to the accompanying figures. Note that as for the similar structure to that of the light emitting device in the first embodiment, the explanation thereof will be omitted below.

Figure 9:
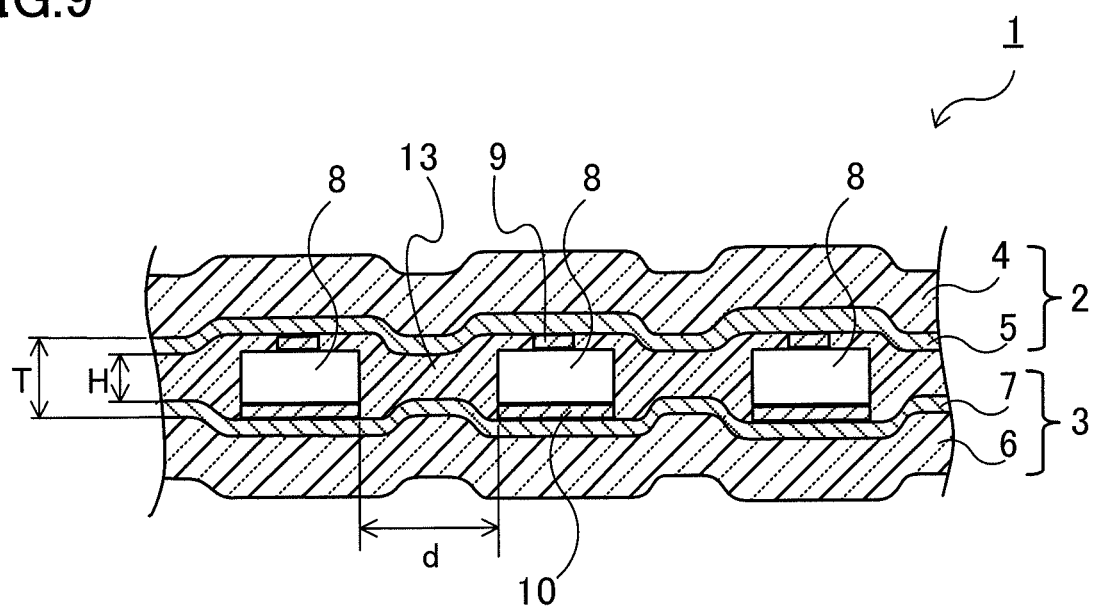
FIG. 9 is an exemplary cross-sectional view illustrating a schematic structure of a light emitting device according to a second embodiment.
Figure 10:
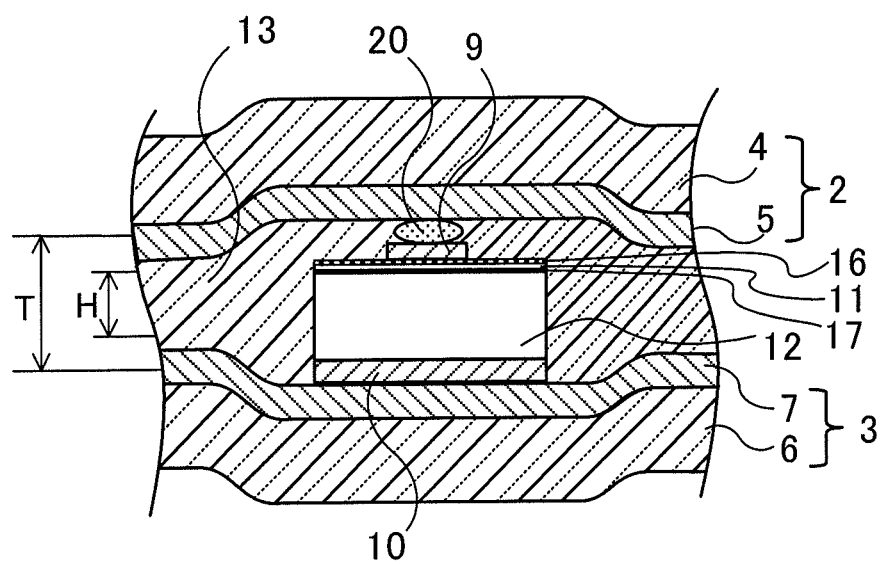
FIG. 10 is a cross-sectional view illustrating a part of the light emitting device in an enlarged manner.

FIG. 9 is an exemplary sectional diagram illustrating a schematic structure of a light emitting device 1 according to this embodiment. In addition, FIG. 10 is a cross-sectional view illustrating a part of the light emitting device 1 in FIG. 9 in an enlarged manner. The light emitting device of this embodiment differs from the light emitting device of the first embodiment that the light emitting diode constructing the light emitting device has electrodes on both surfaces.

As illustrated in FIG. 9, the light emitting device 1 roughly includes the light transmissive supportive substrate 2, the light transmissive supportive substrate 3, a light emitting diode 8, and the light transmissive insulator 13.

The light transmissive supportive substrate 2 includes the light transmissive insulator 4, and the conductive circuitry layer 5 formed on a surface of the light transmissive insulator 4. The light transmissive supportive substrate 3 includes the light transmissive insulator 6, and a conductive circuitry layer 7 formed on a surface of the light transmissive insulator 6.

The light transmissive supportive substrate 2 and the light transmissive supportive substrate 3 are disposed so as to cause the conductive circuitry layer 5 and the conductive circuitry layer 7 to face with each other with a predetermined gap therebetween. The light transmissive insulator 13 is present at portions except the light emitting diode 8 between the light transmissive insulator 4 and the light transmissive insulator 6, the conductive circuitry layer 5, and the conductive circuitry layer 7.

The single or the plurality of light emitting diodes 8 are laid out between the surface of the light transmissive supportive substrate 2 on which the conductive circuitry layer 5 is formed and the surface of the light transmissive supportive substrate 3 on which the conductive circuitry layer 7 is formed. The light emitting diode 8 has an electrode 9 and an electrode 10 provided at the light-emitting-surface side and the opposite-surface side, respectively. The electrode 9 is electrically connected to the conductive circuitry layer 5, while the electrode 10 is electrically connected to the conductive circuitry layer 7, respectively.

A light emitting diode chip (LED chip) that contains a P-N junction can be used as the light emitting diode 8. Note that the light emitting diode 8 is not limited to the LED chip, and may be a laser diode (LD) chip, etc. As for the light emitting diode 8, for example, any of the following structures is applicable: a structure having a P-type semiconductor layer formed on an N-type semiconductor substrate; a structure having an N-type semiconductor layer formed on a P-type semiconductor substrate; a structure having an N-type semiconductor layer and a P-type semiconductor layer both formed on a semiconductor substrate; a structure having a P-type hetero semiconductor layer and an N-type hetero semiconductor layer both formed on a P-type semiconductor substrate; and a structure having an N-type hetero semiconductor layer and a P-type hetero semiconductor layer both formed on an N-type semiconductor substrate. In addition, an LED that is a type having the LED bonded on a metal supportive substrate like CuW, or a semiconductor supportive substrate, such as Si, Ge, GaAs, and the P-N junction transferred from the original semiconductor substrate to the supportive substrate is also applicable.

As illustrated in FIG. 10, the light emitting diode 8 applied in this embodiment includes a light-emitting-diode main body 12 that includes a light emitting layer (light emitting part of P-N junction boundary or a double hetero junction structure) 11 held between a P-type semiconductor layer 16 or 17 and an N-type semiconductor layer 17 or 16, and the electrodes 9 and 10 provided on the upper surface of the light-emitting-diode main body 12 and the lower surface thereof, respectively.

As illustrated in FIG. 10, the electrode 9 contacts the conductive circuitry layer 5 via a conductive bump 20, thereby being electrically connected to the conductive circuitry layer 5. The electrode 10 contacts the conductive circuitry layer 7, thereby being electrically connected to the conductive circuitry layer 7.

The light emitting diode 8 emits light by a DC voltage applied via the electrodes 9, 10. In addition, the light-emitting-diode main body 12 may also contain a light reflection layer, a current diffusion layer, and a light transmissive electrode, etc. in this case, the light-emitting-diode main body 12 also contains a light reflection layer, a current diffusion layer, and a light transmissive electrode.

The conductive bump 20 employs the same structure as that of the conductive bump in the first embodiment. It is preferable that the height of the conductive bump 20 should be equal to or higher than 5 μm and equal to or lower than 50 μm, and more preferably, equal to or higher than 10 μm and equal to or lower than 30 μm. When the height of the conductive bump 20 is less than 5 μm, the short-circuit prevention effect between the conductive circuitry layer 5 and the semiconductor layer 16 decreases, which is not suitable. Conversely, when the height of the conductive bump 20 exceeds 50 μm, in the vacuum thermal pressing process in the manufacturing process of the light emitting device, the conductive bump 20 deforms the first support base, resulting in a poor visual inspection result and a poor connection, which is not suitable.

In addition, as will be explained later in detail with reference to the following example and table 1, it is preferable that a ratio a/b between a vertical distance a from the surface of the LED chip to the tip of the bump and a maximum distance b between the bump center position in a planar direction and the end of the LED chip should be equal to or larger than 0.120 and equal to or smaller than 0.400 in order to ensure the reliability of the light emitting device of the present disclosure, and more preferably, the ratio a/b should be equal to or larger than 0.130 and equal to or smaller than 0.380.

It is preferable that a contact area between the electrode 9 of the LED chip and the conductive bump 20 should be equal to or larger than 100 µm$^2$ and equal to or smaller than 15000 µm$^2$, and more preferably, equal to or larger than 400 µm$^2$ and equal to or smaller than 8000 µm$^2$. Each of those dimensions are measured values under a stable environment in which a room temperature and the temperature of a measurement object are 20° C.±2° C.

The conductive circuitry layer 5 and the conductive circuitry layer 7 are formed on the respective surfaces of the light transmissive insulators 4, 6. The conductive circuitry layer 7 employs the similar structure to that of the conductive circuitry layer 5 explained in the first embodiment.

The light transmissive insulator 13 is embedded in a space between the light transmissive supportive substrate 2 and the light transmissive supportive substrate 3 except a part where the plurality of light emitting diodes 8 is disposed. It is preferable that the light transmissive insulator 13 should not be melted at the Vicat softening temperature and have the tensile storage elastic modulus of equal to or higher than 0.1 MPa at the Vicat softening temperature. It is preferable that the light transmissive insulator 13 should have a melting-point temperature of equal to or higher than 180° C. or a melting-point temperature higher than the Vicat softening temperature by equal to or higher than 40° C. In addition, it is preferable that the light transmissive insulator 13 should have a glass transition temperature of equal to or lower than −20° C.

It is further preferable that the elastomer which is the material for the light transmissive insulator 13 should have a peel strength (through method A defined in JIS C5061 8.1.6) of equal to or higher than 0.49 N/mm for the light transmissive insulator 13 formed of that material relative to the conductive circuitry layers 5, 7.

By applying the elastomer, etc., that satisfies the above-explained Vicat softening temperature, tensile storage elastic modulus, and melting-point temperature, with the light transmissive insulator 13 being intimately in contact with the plurality of light emitting diodes 8, the light transmissive insulator 13 can be embedded between the light transmissive supportive substrate 2 and the light transmissive supportive substrate 3. In other words, the contacting condition between the conductive circuitry layer 5 and the electrode 9 (a first electrode with a bump, the same is true in the following explanation), and the contacting condition between the conductive circuitry layer 7 and the electrode 10 are maintained by the light transmissive insulator 13 that is disposed so as to be intimately in contact with the periphery of the light emitting diode 8.

Hence, the electrical connection reliability between the conductive circuitry layer 5 and the electrode 9, and that between the conductive circuitry layer 7 and the electrode 10 can be enhanced when, in particular, a flex test, a thermal cycle test (TCT), etc., are performed on the light emitting device 1.

When the Vicat softening temperature of the light transmissive insulator 13 exceeds 160° C., the light transmissive insulation resin sheet does not sufficiently deform in a process of forming the light transmissive insulator 13 to be explained later, and thus the electrical connection between the conductive circuitry layer 5 and the electrode 9, and that between the conductive circuitry layer 7 and the electrode 10 decrease. When the Vicat softening temperature of the light transmissive insulator 13 is lower than 80° C., the holding of the light emitting diode 8 decreases, and thus the electrical connection reliability between the conductive circuitry layer 5 and the electrode 9, and that between the conductive circuitry layer 7 and the electrode 10 decrease. It is preferable that the Vicat softening temperature of the light transmissive insulator 13 should be equal to or higher than 100° C. This further enhances the electrical connection reliability between the conductive circuitry layer 5 and the electrode 9, and that between the conductive circuitry layer 7 and the electrode 10. It is preferable that the Vicat softening temperature of the light transmissive insulator 13 should be equal to or lower than 140° C. This further enhances the electrical connection between the conductive circuitry layer 5 and the electrode 9, and that between the conductive circuitry layer 7 and the electrode 10.

When the tensile storage elastic modulus of the light transmissive insulator 13 between 0 and 100° C. is less than 0.01 GPa, the electrical connection between the conductive circuitry layer 5 and the electrode 9, and that between the conductive circuitry layer 7 and the electrode 10 also decrease.

Since the light emitting diode 8, and the electrodes 9, 10 thereof are microstructures, in order to precisely connect the electrodes 9, 10 of the plurality of light emitting diodes 8 at the time of vacuum thermal compression bonding to be explained later to the predetermined portions of the conductive circuitry layer 5 and conductive circuitry layer 7, it is necessary for the light transmissive insulation resin sheet 13' to maintain a relatively high storage elastic modulus from the room temperature to the temperature around the heating temperature of the vacuum thermal compression bonding process.

When the elastic modulus of the resin decreases at the time of vacuum thermal compression bonding, a tilting of the light emitting diode 8 and a lateral fine displacement thereof occur during the process, resulting in an unsuccessful electrical connection between the electrode 9, 10 and the conductive circuitry layer 5, 7, or an increase in the connection resistance, etc. Those are factors that will decrease the manufacturing yield of the light emitting device 1 and the reliability thereof. In order to avoid those events, the light transmissive insulator 13 that has a tensile storage elastic modulus of equal to or higher than 0.01 GPa between 0 to 100° C. is applied.

When, however, the storage elastic modulus is too high, the flex resistance, etc., of the light emitting device 1 decreases, and thus the light transmissive insulator 13 that has a tensile storage elastic modulus of equal to or lower than 10 GPa between 0 to 100° C. is applied. It is preferable that the light transmissive insulator 13 should have a tensile storage elastic modulus of equal to or higher than 0.1 GPa between 0 to 100° C., and equal to or lower than 7 GPa.

When the elastomer, etc., that forms the light transmissive insulator 13 is not melted at the Vicat softening temperature, and the tensile storage elastic modulus at the Vicat softening temperature is equal to or higher than 0.1 MPa, the vertical positional precision among the electrodes 9, 10 and the conductive circuitry layers 5, 7 at the time of vacuum thermal compression bonding can be further improved.

In view of the foregoing, it is preferable that the elastomer forming the light transmissive insulator 13 should have a melting-point temperature of equal to or higher than 180° C. or a melting-point temperature higher than the Vicat softening temperature by equal to or higher than 40° C. It is more preferable that the tensile storage elastic modulus of the elastomer at the Vicat softening temperature should be equal to or higher than 1 MPa. In addition, it is more preferable that the melting-point temperature of the elastomer should be equal to or higher than 200° C. or a melting-point temperature higher than the Vicat softening temperature by equal to or higher than 60° C.

Still further, in order to improve not only the manufacturability of the light emitting device 1 but also the flex resistance of the light emitting device 1 and the thermal cycle resistance characteristic thereof across a broad temperature range from a low temperature to a high temperature, it is important for the light transmissive insulator 13 to have a balance among characteristics that are the Vicat softening temperature, the tensile storage elastic modulus, and the glass transition temperature. By applying the elastomer that satisfies the above-explained tensile storage elastic modulus, the flex resistance of the light emitting device 1 and the thermal cycle resistance characteristic thereof can be enhanced.

However, depending on an outdoor application and a living environment in winter although in an indoor application, a flex resistance and a thermal cycle resistance characteristic at a low temperature are required. When the glass transition temperature of the elastomer is too high, the flex resistance of the light emitting device 1 and the thermal cycle resistance characteristic thereof under a low-temperature environment may decrease. Hence, it is preferable to apply the elastomer that has a glass transition temperature of equal to or lower than −20° C. Based on such glass transition temperature and tensile storage elastic modulus, the flex resistance of the light emitting device 1 and the thermal cycle resistance characteristic thereof can be improved across a broad temperature range from a low temperature to a high temperature. It is more preferable that the glass transition temperature of the elastomer should be equal to or lower than −40° C.

The thickness of the light transmissive insulator 13 may be equal to a gap between the light transmissive supportive substrate 2 and the light transmissive supportive substrate 3 based on the height of the light emitting diode 8, but in order to enhance the contact between the conductive circuitry layer 5, 7 and the electrode 9, 10, such a thickness should be preferably thinner than the height of the light emitting diode 8. In addition, it is more preferable to design that a thickness (T) of the light transmissive insulator 13 should satisfy a condition such that a difference (H−T) from a height (H) of the light emitting diode 8 is within a range between 5 to 200 µm.

However, when the thickness (T) of the light transmissive insulator 13 is too thin, it may become difficult to maintain the shape of the light transmissive insulator 13 and the intimate adhesion, etc., relative to the light emitting diode 8 may decrease. Hence, it is preferable that the difference (H−T) between the height (H) of the light emitting diode 8 and the thickness (T) of the light transmissive insulator 13 should be equal to or smaller than ½ of the height (H) of the light emitting diode 8.

According to this embodiment, in the flexible light transmissive light emitting device that has the light emitting diodes embedded therein, even if such a device is flexed, the conductive bump 20 ensures the sufficient height, and thus a short-circuit can be prevented.

<Manufacturing Method>

FIGS. 11A to 11D are diagrams for explaining the manufacturing method of the light emitting device according to this embodiment. The manufacturing method of the light emitting device 1 according to this embodiment will be explained with reference to FIGS. 11A to 11D.

First of all, the light emitting diode 8 that has the electrode 9 formed on one side and the electrode 10 formed on the other side (anode electrode and cathode electrode or cathode electrode and anode electrode) is prepared. Next, the conductive bump 20 is formed on the electrode 9 (electrode pad) of the LED chip. As for the method of forming the conductive bump 20, a method of forming a gold or gold alloy bump from an Au wire or an Au alloy wire using a wire bump forming machine is applicable. It is preferable that the applied wire should have a diameter of equal to or larger than 15 µm and equal to or smaller than 75 µm.

In this embodiment, a wire bonding apparatus is applied, discharging is performed on the wire tip to melt the metal and to form a ball. Next, ultrasound is applied to connect such a ball to the pad electrode. Subsequently, with the ball being connected to the pad electrode, the wire is cut out from the ball. As for the bump 20, like the bump 30 in the first embodiment, the rounding process is performed. In this case, this rounding process may be performed using a resin sheet.

Figure 12A:
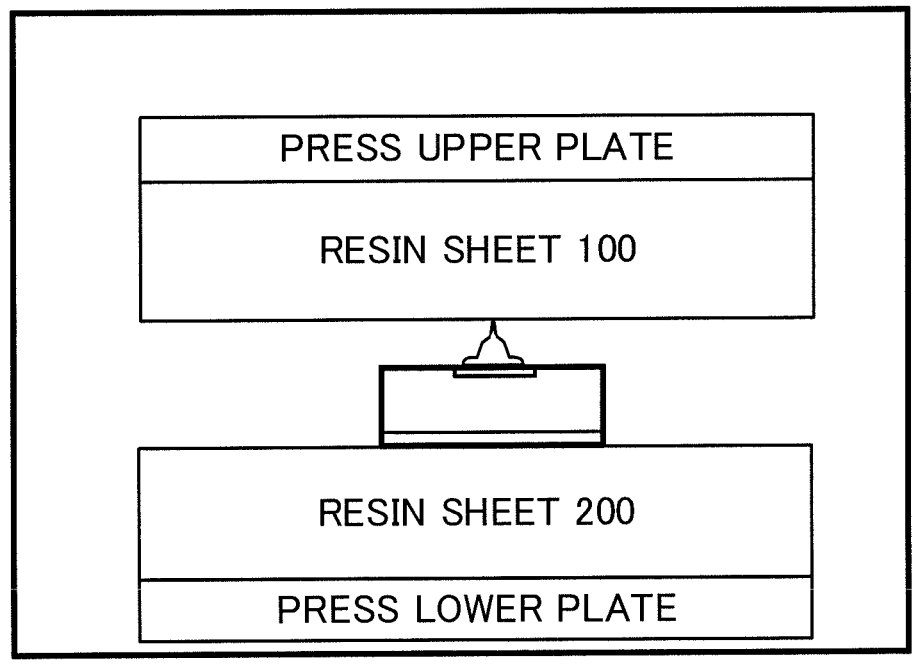
FIG. 12A is a diagram for explaining a layout of LED chips before and after a press work.
Figure 12B:
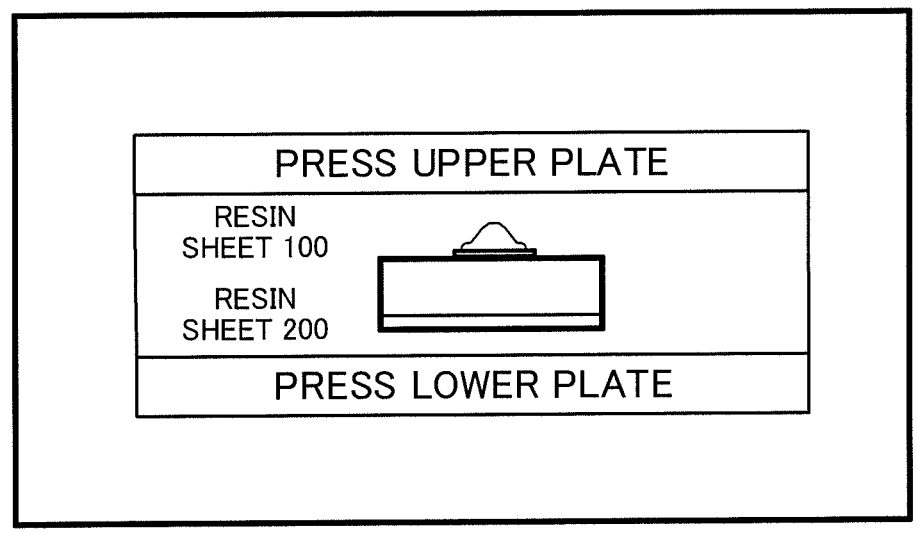
FIG. 12B is a diagram for explaining a layout of LED chips before and after a press work.

FIG. 12A is a diagram illustrating a layout of the light emitting diodes prior to a press work. FIG. 12B is a diagram illustrating the layout of the light emitting diodes after the press work. As illustrated in FIG. 12A, when pressure is applied so as to hold the light emitting diodes between the press upper plate of the press apparatus and the press lower plate thereof to perform pressing, as illustrated in FIG. 12B, the bump formation surface of the light emitting diode is embedded in the resin sheet 100. In addition, the opposite surface of the light emitting diode to the bump formation surface is embedded in the resin sheet 200.

After the presswork as illustrated in FIG. 12B, the resin sheets 100, 200 are peeled off. Consequently, the wire portion of the bump formed on the LED chip and left on the upper portion of the bump when the wire is cut at the time of bump formation has been crushed by the resin sheet 100, and thus a continuous surface is formed on the upper portion of the bump (see FIG. 7C). At this time, by adjusting the resin hardness and the pressing force, the bump height B can be adjusted. Note that the LED chip may be directly disposed on the press lower plate without the resin sheet 200 being disposed at the time of pressing.

Next, the light transmissive supportive substrate 2 that includes the light transmissive insulator 4 and the conductive circuitry layer 5 formed on the surface thereof, and, the light transmissive supportive substrate 3 that includes the light transmissive insulator 6 and the conductive circuitry layer 7 formed on the surface thereof, are prepared. The material and formation method of the conductive circuitry layer 5 and those of the conductive circuitry layer 7 are the same as those explained above.

Next, the light transmissive insulation resin sheet 14 that has a Vicat softening temperature within a range between 80 to 160° C. is prepared. In addition to the above-explained Vicat softening temperature, it is preferable that the light transmissive insulation resin sheet 14 should contain a resin that is a major element which does not melt at the Vical softening temperature with the tensile storage elastic modulus being within a range between 0.01 and 10 GPa within a temperature range between 0 to 100° C., has the tensile storage elastic modulus of equal to or higher than 0.1 MPa at the Vicat softening temperature, has the melting-point temperature of equal to or higher than 180° C. or higher than the Vicat softening temperature by equal to or higher than 40° C., and has the glass transition temperature of equal to or lower than −20° C. It is preferable that the light transmissive insulation resin sheet 14 should be formed of an elastomer sheet, and more preferably, an acrylic-based elastomer sheet.

Figure 11A:
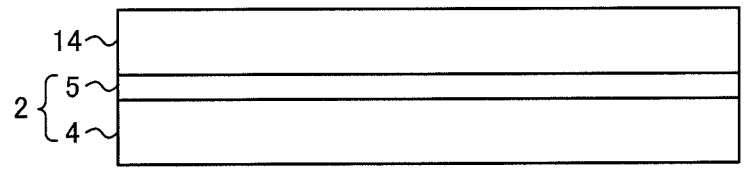
FIG. 11A is a diagram for explaining a manufacturing method of the light emitting device according to the second embodiment.

Next, the light transmissive insulation resin sheet 14 is disposed on the conductive circuitry layer 5 of the light transmissive supportive substrate 2 so as to cover the entire conductive circuitry layer 5 (see FIG. 11A). The light transmissive insulation resin sheet 14 is formed in a shape that is capable of covering the entire conductive circuitry layer 5, in addition, the entire light transmissive insulator 4 including a part of the conductive circuitry layer 5 where the light emitting diode 8 is to be disposed.

Figure 11B:
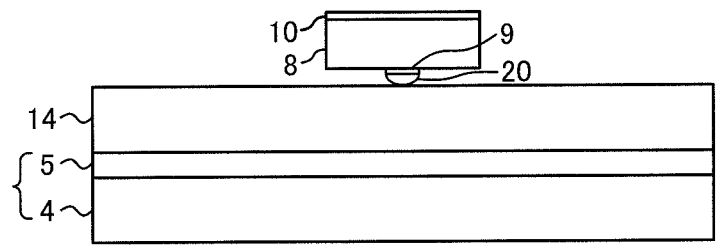
FIG. 11B is a diagram for explaining a manufacturing method of the light emitting device according to the second embodiment.

Next, the plurality of light emitting diodes 8 is laid out on the light transmissive insulation resin sheet 14 (see FIG. 11B). The light emitting diodes 8 are laid out in such a way that the electrode 9 on which the conductive bump 20 is formed is located at the light-transmissive-insulation-resin-sheet-14 side, i.e., at the conductive-circuitry-layer-5 side.

Figure 11C:
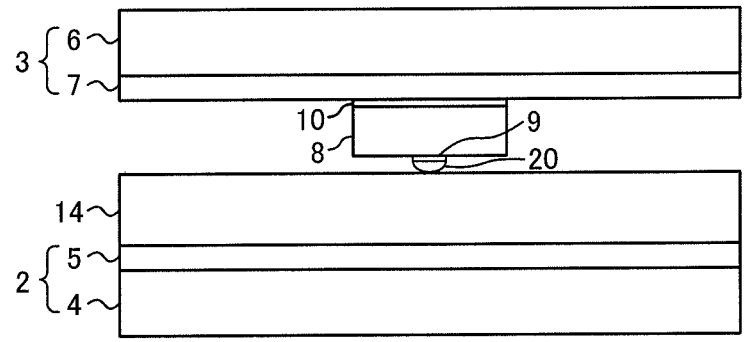
FIG. 11C is a diagram for explaining a manufacturing method of the light emitting device according to the second embodiment.

The light transmissive supportive substrate 3 that has the conductive circuitry layer 7 formed on the surface of the light transmissive insulator is disposed on the light emitting diodes 8 (see FIG. 11C).

By executing the processes illustrated in FIG. 11A to FIG. 11C, with the electrode 9 being located at the light-transmissive-insulation-resin-sheet-14 side, and the electrode 10 being located at the light-transmissive-supportive-substrate-3 side, the light emitting diode 8 is laid out between the light transmissive insulation resin sheet 14 and the light transmissive supportive substrate 3.

It is appropriate if the light transmissive insulation resin sheet 14 has a thickness capable of sufficiently filling a space between the light transmissive supportive substrate 2 and the light transmissive supportive substrate 3 in a vacuum thermal compression bonding process to be explained later, i.e., a space based on the gap between the light transmissive supportive substrate 2 and the light transmissive supportive substrate 3 produced by the laid-out light emitting diodes 8.

More specifically, it is appropriate if the thickness of the light transmissive insulation resin sheet 14 is capable of sufficiently filling a gap between the light transmissive supportive substrate 2 and the light transmissive supportive substrate 3 based on the height of the light emitting diode 8 as explained above. When the thickness (T) of the light transmissive insulator 13 is designed so as to be thinner than the height (H) of the light emitting diode 8, it is appropriate to design the thickness of the light transmissive insulation resin sheet 14 in accordance with the difference (H−T).

Figure 11D:
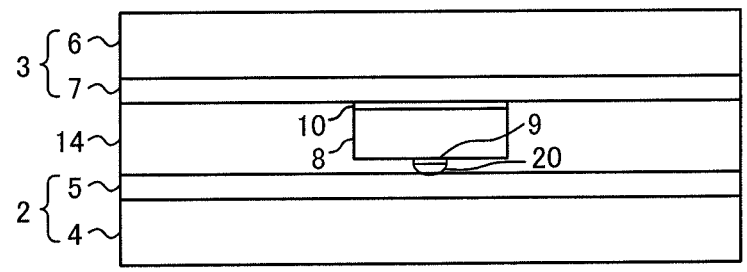
FIG. 11D is a diagram for explaining a manufacturing method of the light emitting device according to the second embodiment.

Next, as illustrated in FIG. 11D, a laminated body that includes the light transmissive supportive substrate 2, the light transmissive insulation resin sheet 14, the light emitting diodes 8, and the light transmissive supportive substrate 2 laminated in this order is pressurized under a vacuum condition while being heated.

As for the heating and pressurizing process (vacuum thermal compression bonding process) for the laminated body under the vacuum condition, it is preferable that heating and pressurization are performed on the laminated body up to a temperature T within a range $Mp-10$ (° C.)$\leq T \leq Mp+30$ (° C.) where Mp is the Vicat softening temperature (° C.) of the light transmissive insulation resin sheet 14. A more preferable heating temperature is within a range $Mp-10$ (° C.)$\leq T \leq Mp+10$ (° C.). By applying such a heating condition, with the light transmissive insulation resin sheet 14 being softened appropriately, the laminated body can be pressurized.

Hence, the electrode 9 with the bump disposed on the conductive circuitry layer 5 via the light transmissive insulation resin sheet 14 is connected to the predetermined portion of the conductive circuitry layer 5, and the electrode 10 is connected to the predetermined portion of the conductive circuitry layer 7, and, the softened light transmissive insulation resin sheet 14 is embedded between the light transmissive supportive substrate 2 and the light transmissive supportive substrate 3, thereby forming the light transmissive insulator 13.

When a heating temperature T of the laminated body at the time of vacuum thermal compression bonding is lower than a temperature ($T<Mp-10$) that is lower than the Vicat softening temperature Mp of the light transmissive insulation resin sheet 14 by 10 (° C.), the softening of the light transmissive insulation resin sheet 14 becomes insufficient, resulting in a possibility that the intimate adhesion of the light transmissive insulation resin sheet 14 (and thus light transmissive insulator 13) to the light emitting diode 8 decreases.

In addition, there is also a possibility that a part of the light transmissive insulation resin sheet 14 (and thus light transmissive insulator 13) is not properly filled in the space between the portion of the light emitting surface of the light-emitting-diode main body 12 where no electrode 9 is formed and the conductive circuitry layer 5. When the heating temperature T exceeds a temperature ($Mp+30<T$) that is higher than the Vicat softening temperature Mp of the light transmissive insulation resin sheet 14 by 30 (° C.), the light transmissive insulation resin sheet 14 becomes too soft, possibly causing a defective shape.

The connection between the electrode 10 and the conductive circuitry layer 7 may be accomplished by a direct contact or via a conductive adhesive, etc.

<Thermal Compression Bonding Process>

It is preferable that the thermal compression bonding process for the laminated body in the vacuum condition should be carried out as follow. The above-explained laminated body is pre-pressurized to cause respective components intimately in contact with each other. Next, air in a work space where the pre-pressurized laminated body is disposed is drawn to accomplish the vacuum condition, and pressurization is performed while the laminated body is heated to the above-explained temperature. By performing thermal compression bonding on the pre-pressurized laminated body under the vacuum condition in this way, the softened light transmissive insulation resin sheet 14 can be filled in the space between the light transmissive supportive substrate 2 and the light transmissive supportive substrate 3 without any void.

It is preferable that the vacuum condition at the time of thermal compression bonding should be equal to or lower than 5 kPa. The pre-pressurizing process may be omitted, but in this case, misalignment, etc., is likely to occur in the laminated body, and thus execution of the pre-pressurizing process is preferable.

When the thermal compression bonding process for the laminated body is performed under an atmospheric condition or a low vacuum condition, air bubbles are likely to be left in the light emitting device 1 having undergone the thermal compression bonding, in particular, around the light emitting diode 8. Since the air bubbles left in the light emitting device 1 are pressurized, this may cause an expansion of the light emitting device 1 having undergone the thermal compression bonding or a peeling of the light emitting diode 8 from the light transmissive supportive substrate 2 and the light transmissive supportive substrate 3.

In addition, when the air bubbles and expansion are present in the light emitting device 1, in particular, near the light emitting diode 8, light to be emitted will be scattered non-uniformly, which is not preferable since it becomes a problem in the visual inspection of the light emitting device 1.

In this embodiment, a production of air bubbles in the light emitting device 1 can be suppressed based on various characteristics of the light transmissive insulator 13 and the vacuum thermal compression bonding condition, etc. It is preferable that there should be no remaining air bubble in the light emitting device 1 which has an outer diameter of equal to or larger than 500 μm or is equal to or larger than the external dimension of the light emitting diode 8.

The pressurization force applied to the laminated body at the time of vacuum thermal compression bonding varies depending on the heating temperature, the material and thickness of the light transmissive insulation resin sheet 14, and the final thickness of the light transmissive insulator 13, etc., but it is preferable that such pressurization force should be normally within a range between 0.5 to 20 MPa, and more preferably, within a range between 1 to 12 MPa. By applying such pressurization force, the performance of embedding the softened light transmissive insulation resin sheet 14 in the gap between the light transmissive supportive substrate 2 and the light transmissive supportive substrate 3 can be improved. In addition, a reduction of the characteristics of the light emitting diode 8 and a damage thereto, etc., can be suppressed.

As explained above, with the light transmissive insulation resin sheet 14 being present between the conductive circuitry layer 5 and the electrode 9 of the light emitting diode 8, by performing the vacuum thermal compression bonding process, the light transmissive insulator 13 intimately in contact around the light emitting diode 8 can be obtained while the electrode 9 with the bump and the electrode 10 are electrically connected to the conductive circuitry layer 5 and the conductive circuitry layer 7, respectively. In addition, a part of the light transmissive insulator 13 can be filled excellently in the space between the portion of the light-emitting-diode main body 12 where no electrode 9 is formed and the conductive circuitry layer 5, and thus remaining air bubbles can be suppressed. Hence, it becomes possible to obtain the light emitting device 1 that has enhanced electrical connection reliability between the conductive circuitry layer 5, 7 and the electrode 9, 10.

According to the manufacturing method in this embodiment, the light emitting device which has the improved electrical connection between the conductive circuitry layers 5, 7 and the electrodes 9, 10 of the light emitting diode 8 and the enhanced reliability thereof can be manufactured with an excellent reproducibility.

As is clear from FIGS. 13 and 14, according to the light emitting device 1, the conductive circuitry layer 5 has a contact area with the conductive bump 20 of the light emitting diode 8 concaved along the conductive bump 20. Hence, the contact area between the conductive bump 20 and the conductive circuitry layer 5 can be increased. Consequently, a resistance between the conductive bump 20 and the conductive circuitry layer 5 can be reduced.

In this embodiment, although the explanation has been given of an example case in which the light transmissive insulator is formed of a single-layer sheet, the light transmissive insulator may be formed of two light transmissive insulation resin sheets, and with the light emitting diode being held between the two light transmissive insulation resin sheets, pressurization may be applied to the first light transmissive support base and the second light transmissive support base to obtain the structure illustrated in FIG. 10.

EXAMPLE

Next, specific examples and evaluation results thereof will be explained.

TABLE 1

| | CHIP SIZE μm□ | BUMP HEIGHT μm | DISTANCE FROM CHIP SURFACE TO BUMP TIP (a) μm | POSITION OF CHIP AND BUMP | DISTANCE BETWEEN CHIP ENDS MOST DISTANCE FROM BUMP CENTER (b) μm | a/b | FLEX TEST | | | |
|---|---|---|---|---|---|---|---|---|---|---|
| | | | | | | | FLEX RADIUS (mm) | NUMBER OF LIGHT EMITTING SAMPLES | FLEX RADIUS (mm) | NUMBER OF LIGHT EMITTING SAMPLES |
| EXAMPLE 1 | 220 | 5 | 7 | CHIP CENTER | 156 | 0.045 | 50 | 3/6 | 40 | 0/6 |
| EXAMPLE 2 | 350 | 5 | 7 | CHIP CENTER | 247 | 0.028 | 50 | 2/6 | 40 | 0/6 |
| EXAMPLE 3 | 220 | 10 | 12 | CHIP CENTER | 156 | 0.077 | 50 | 4/6 | 40 | 0/6 |
| EXAMPLE 4 | 350 | 10 | 12 | CHIP CENTER | 247 | 0.048 | 50 | 3/6 | 40 | 0/6 |
| EXAMPLE 5 | 220 | 20 | 22 | CHIP CENTER | 156 | 0.141 | 50 | 6/6 | 20 | 6/6 |
| EXAMPLE 6 | 220 | 20 | 22 | POSITION ¼ FROM END OF CHIP ON DIAGONAL LINE | 233 | 0.094 | 50 | 5/6 | 30 | 1/6 |
| EXAMPLE 7 | 350 | 20 | 22 | CHIP CENTER | 247 | 0.089 | 50 | 4/6 | 30 | 0/6 |
| EXAMPLE 8 | 220 | 30 | 32 | CHIP CENTER | 156 | 0.206 | 50 | 6/6 | 20 | 6/6 |
| EXAMPLE 9 | 350 | 30 | 32 | CHIP CENTER | 247 | 0.129 | 50 | 6/6 | 20 | 6/6 |
| EXAMPLE 10 | 220 | 40 | 42 | CHIP CENTER | 156 | 0.270 | 50 | 6/6 | 20 | 6/6 |
| EXAMPLE 11 | 350 | 40 | 42 | CHIP CENTER | 247 | 0.170 | 50 | 6/6 | 20 | 6/6 |
| EXAMPLE 12 | 220 | 50 | 52 | CHIP CENTER | 156 | 0.334 | 50 | 6/6 | 20 | 6/6 |
| EXAMPLE 13 | 350 | 50 | 52 | CHIP CENTER | 247 | 0.210 | 50 | 6/6 | 20 | 6/6 |
| EXAMPLE 14 | 220 | 60 | 65 | CHIP CENTER | 156 | 0.417 | 50 | 3/6 | 20 | 4/6 |
| COMP EXAMPLE 1 | 220 | none | — | — | — | — | 50 | 1/6 | 40 | 0/6 |
| COMP EXAMPLE 2 | 350 | none | — | — | — | — | 50 | 0/6 | 40 | 0/6 |

LED chips according to first to fourteenth examples in table 1 and to first to second comparative examples were prepared. All chips had a thickness of 150 μm. A bump was formed on the first electrode of the LED chip (in Examples 1-14) by a gold wire bonder, and the rounding process was performed to produce a bump with a height indicated in table 1.

Next, polyethylene-terephthalate sheets that were first and second light transmissive supportive substrates with no bump and with a thickness of 180 μm were also prepared. A silver mesh electrode was formed on the surface of such a substrate to create a conductive circuitry layer.

A light transmissive insulation resin sheet that was an acrylic-based elastomer sheet which had a Vicat softening temperature of 110° C., a melting-point temperature of 220° C., a glass transition temperature of −40° C., a tensile storage elastic modulus of 1.1 GPa at 0° C., the tensile storage elastic modulus of 0.3 GPa at 100° C., and the tensile storage elastic modulus of 0.2 GPa at 110° C. that was the Vicat softening temperature, and, a thickness of 60 μm was prepared as the first and second light transmissive insulation resin sheets.

The Vicat softening temperature was obtained, using No. 148-HD-PC heat distortion tester available from Yasuda Seiki Seisakusho Ltd., under a condition in which a test load was 10 N, and a temperature rise rate of 50° C./hour, and also under A50 condition defined in JIS K7206 (ISO 306).

The glass transition temperature and the melting-point temperature were obtained by a method conforming to JIS K7121 (ISO 3146) using a DSC-60 differential scanning calorimeter made by SHIMADZU Corporation through a heat flux differential scanning calorimetry at a temperature rise rate of 5° C./min.

The tensile storage elastic modulus was obtained, using a DDV-01 GP dynamic viscosity automated measuring instrument available from A & D Company, Ltd., by rising a temperature from −100° C. to 200° C. at a temperature rise equal rate of 1° C./min conforming to JIS K7244-1 (ISO 6721) and at a frequency of 10 Hz.

The second light transmissive insulation resin sheet was placed on the conductive circuitry layer of the second light transmissive supportive substrate so as to cover the entire conductive circuitry layer and light transmissive insulator, and six LED chips were laid out at a predetermined location on the second light transmissive insulation resin sheet. The six LED chips were each laid out in such a way that the second electrode was located at the second-light-transmissive-insulation-resin-sheet side. The first light transmissive insulation resin sheet and the first light transmissive supportive substrate were laminated on the six LED chips. The first light transmissive insulation resin sheet was placed in such a way that the conductive circuitry layer of the first light transmissive supportive substrate was located at the first-light-transmissive-insulation-resin-sheet side. The first light transmissive insulation resin sheet was formed in a shape that covered the entire conductive circuitry layer of the first light transmissive supportive substrate and light transmissive insulator.

Next, a laminated body that had the second light transmissive supportive substrate, the second light transmissive insulation resin sheet, the LED chips, the first light transmissive insulation resin sheet, and the first light transmissive supportive substrate laminated in this order was pre-pressed at a pressure of 0.1 MPa, and the air was drawn from the work space to accomplish a vacuum condition of 0.1 kPa. The laminated body was pressed at a pressure of 9.8 MPa under a vacuum condition of 5 kPa while being heated at 120° C. The heating and pressurizing condition was maintained for 10 minutes to electrically connect the electrode of the LED chip to the conductive circuitry layer and to cause the first and second light transmissive insulation resin sheets to be embedded between the first light transmissive supportive substrate and the second light transmissive supportive substrate, and thus the light transmissive insulator was formed.

Subsequently, external wirings were connected to the conductive circuitry layer, and thus 12 light emitting devices each having six LED chips connected in series and emitting light when a current was supplied from an external circuit were produced. In addition, as the first comparative example and the second comparative example, except that the LED chip which had no bump formed was utilized, 12 light emitting devices through the same processes as first to fourteenth examples were produced for each comparative example. The obtained light emitting devices were subjected to characteristics evaluation to be explained later.

The respective characteristics of the light emitting devices according to the first to fourteenth examples and first to second comparative examples were evaluated as follow. Six samples were prepared for each of the first to fourteenth examples and first to second comparative examples. As for the six samples of each example, a flex resistance test defined in JIS C5016 (IEC249-1 and IEC326-2) 8.6 was carried out in an electrically conducted condition. This flex resistance test was carried out for all samples under an environment in which the temperature was 35±2° C., the relative humidity was 60 to 70%, and the atmospheric pressure was 86 to 106 kPa. The six samples were flexed in such a way that the LED chip string was moved toward the center of flexed part and the second conductive circuitry layer was moved inwardly in a direction orthogonal to the laid-out direction of the LED chips, and the minimum flexure radius (minimum value of flexure radius still enabling a light emission) of the sample flexed in the direction orthogonal to the laid-out direction of the LED chips was examined.

First of all, plural kinds of measurement circular cylinders that had a cross-section in a true circular shape were prepared. Next, the obtained light emitting device was set to the circular cylinder in such a way that the back surface to the light emitting surface of the LED chip was in contact with the curved surface of the measurement circular cylinder. The light emitting device was actuated to emit light, and in this condition, the light emitting device was flexed by 180 degrees along the curved surface of the measurement circular cylinder. This flex test was carried out in the order from the measurement circular cylinder with the largest radius to the measurement circular cylinder with the smallest radius, and the examination was made for up to which curvature radius of the measurement circular cylinder the light emitting condition was still maintained. Table 1 shows the results.

As is clear from table 1, it was confirmed that the light emitting devices of the fifth example and the eighth to fourteenth examples maintained the light emitting condition even if the flex radius was reduced in the flex resistance test.

The embodiments of the present disclosure have been explained above, but the present disclosure is not limited to the above-explained embodiments. For example, the conductive bump applied in the foregoing embodiments may be a wire bump formed using a wire bonder, or bumps formed by electrolytic plating, non-electrolytic plating, inkjet printing and calcining of an ink containing metal micro particle, printing of a paste containing metal micro particle, coating ball mounting, pellet mounting, vapor deposition sputtering, etc. In addition, the bump is not limited to those types, and various conductive bump like a lift-off bump is also applicable.

In addition, the conductive bump may be formed of a mixture of metal micro particle with a resin. In this case, for example, a metal, such as a silver (Ag) or copper (Cu), or an alloy thereof may be mixed in a thermosetting resin to obtain a paste, the droplets of the paste may be applied to the electrode by ink jetting or needle dispensing, and solidified by heating to form a conductive bump.

Several embodiments of the present disclosure have been explained, but those embodiments are merely presented as examples, and are not intended to limit the scope of the present disclosure. Those novel embodiments can be carried out in other various forms, and various omissions, replacements, and modifications can be made thereto without departing from the scope of the present disclosure. Those embodiments and modified forms thereof should be within the scope of the present disclosure, and the scope of the invention as recited in appended claims and the equivalent range thereto.

What is claimed is:

1. A light emitting device comprising:
   a first light transmissive supportive substrate that comprises a first light transmissive insulator and a first conductive circuitry layer provided on a surface of the first light transmissive insulator;
   a second light transmissive supportive substrate which comprises a second light transmissive insulator, and which is disposed so as to have a predetermined gap from the first light transmissive supportive substrate;
   a light emitting diode which comprises a light emitting diode main body, and first and second electrodes, the first electrode electrically connecting the light emitting diode main body to the first conductive circuitry layer via a first conductive bump, the light emitting diode is between the first light transmissive supportive substrate and the second light transmissive supportive substrate; and
   a third light transmissive insulator formed in a space between the first light transmissive supportive substrate and the second light transmissive supportive substrate,
   wherein the first light transmissive supportive substrate, the second light transmissive supportive substrate and the third light transmissive insulator have flexibility,
   a height of the first conductive bump is a height at which the first electrode or a semiconductor layer of the light emitting diode main body does not contact the first conductive circuitry layer when the light emitting device is bent with a radius of 50 mm, and the height of the first conductive bump is in the range of from 5 µm to 50 µm.

2. The light emitting device according to claim 1, wherein a surface of the second light transmissive insulator faces the first conductive circuitry layer,
   the light emitting diode comprises the light emitting diode main body, the first electrode is provided on a surface of the light emitting diode main body and a second electrode is provided on the surface of the light emitting diode main body and is electrically connected to the first conductive circuitry layer via a second conductive bump.

3. The light emitting device according to claim 1, wherein the second light transmissive supportive substrate comprises a second conductive circuitry layer provided on a surface of the second light transmissive insulator, and the second conductive circuitry layer faces the first conductive circuitry layer,
   the light emitting diode comprises a light emitting diode main body, the first electrode provided on a surface of the light emitting diode main body and electrically connected to the first conductive circuitry layer via the first conductive bump, and the second electrode provided on an opposite surface of the light emitting diode main body and electrically connected to the second conductive circuitry layer.

4. The light emitting device according to claim 2, wherein a ratio of B/A is in the range of from 0.2 to 0.7, where:
   A is a diameter of a surface of the first conductive bump in contact with the first electrode and B is the height of the first conductive bump, or
   A is a diameter of a surface of the second conductive bump in contact with the second electrode and B is a height of the second conductive bump.

5. The light emitting device according to claim 2, wherein the second conductive bump has a height of equal to or higher than 5 µm and equal to or lower than 50 µm.

6. The light emitting device according to claim 2, wherein a contact area between the first conductive bump and the first electrode, and a contact area between the second conductive bump and the second electrode are each equal to or larger than 100 µm$^2$ and equal to or smaller than 15000 µm$^2$.

7. The light emitting device according to claim 2, wherein a material of the first conductive bump is any one of the following: gold; silver; copper; nickel; and an alloy thereof.

8. The light emitting device according to claim 2, wherein the material of the first conductive bump is any one of the following: gold; silver; copper; nickel; an Au-Sn alloy; and a nickel alloy.

9. The light emitting device according to claim 2, wherein the first conductive bump is a mixture of metal microparticle with a resin.

10. The light emitting device according to claim 2, wherein the first conductive bump has a melting-point temperature of equal to or higher than 180 ° C.

11. The light emitting device according to claim 2, wherein the first conductive bump has a dynamic hardness of equal to or higher than 3 and equal to or lower than 150.

12. The light emitting device according to claim 2, wherein at least one of an upper surface of the first conductive bump and an upper surface of the second conductive is flat.

13. The light emitting device according to claim 2, wherein a ratio between a distance from a surface of the light emitting diode to a top of the first conductive bump, and, a distance from a center of the first conductive bump to a most distant end of the light emitting diode is equal to or larger than 0.120 and equal to or smaller than 0.400.

14. The light emitting device according to claim 2, wherein the first conductive circuitry layer is concaved along the first conductive bump.

15. The light emitting device according to claim 2, wherein the light emitting diode is embedded in the third light transmissive insulator.

16. The light emitting device according to claim 2, wherein the first electrode and the first conductive circuitry layer do not directly contact with each other, but the first conductive bump directly contacts the first conductive circuitry layer.

17. The light emitting device according to claim 1, wherein a contact angle between a first surface of the first electrode and the first conductive bump is equal to or smaller than 135 degrees.

18. The light emitting device according to claim 1, wherein in the first conductive circuitry layer, a portion in contact with the first conductive bump is recessed.

19. The light emitting device according to claim 1, wherein the third light transmissive insulator is filled between the first conductive circuitry layer and the first and second electrodes, and between the first conductive circuitry layer and the semiconductor layer.

20. A flexible light emitting device comprising:
a first light transmissive substrate that comprises a first light transmissive insulator and a conductive layer on the first light transmissive insulator;
a second light transmissive substrate that comprises a second light transmissive insulator, the second light transmissive substrate disposed with a gap from the first light transmissive substrate;
a light emitting diode having a light emitting diode body, and first and second electrodes, the first electrode electrically connecting the light emitting diode body to the conductive layer via a conductive bump, the light emitting diode is located between the first light transmissive substrate and the second light transmissive substrate; and
a third light transmissive insulator formed in a space between the first light transmissive substrate and the second light transmissive substrate, the third light transmissive insulator having a thinner thickness than a height of the light emitting diode;
wherein the first light transmissive substrate in contact with the third light transmissive insulator is formed in a curved shape inwardly from a part where the light emitting diode is laid out and toward a middle portion between an adjoining light emitting diode.

21. The flexible light emitting device according to claim 20, wherein the first light transmissive substrate pushes the conductive layer against the first electrode.

22. The flexible light emitting device according to claim 20,
wherein a height of the conductive bump is equal to or higher than 5 μm and equal to or lower than 50 μm.

23. The flexible light emitting device according to claim 22,
wherein the height of the conductive bump is equal to or higher than 20 μm and
the flexible light emitting device exhibits a light emitting condition is maintained in a flex resistance test, when the flexible light emitting device in a lighting state is wound about a circular cylinder having a 50mm radius.

24. The flexible light emitting device according to claim 20,
wherein the third light transmissive insulator is filled among the conductive layer, a side surface of the conductive bump and an upper surface of the light emitting diode body.

25. The flexible light emitting device according to claim 20,
wherein the conductive layer is concaved along the conductive bump.

26. The flexible light emitting device according to claim 20,
wherein a height of the conductive bump is equal to or higher than 20 μm and equal to or lower than 50 μm, and
a ratio between a distance from a surface of the light emitting diode to a top of the conductive bump, and, a distance from a center of the conductive bump to a most distant end of the light emitting diode is equal to or larger than 0.12 and equal to or smaller than 0.40.

27. A flexible light emitting device comprising:
a first light transmissive substrate having a first light transmissive insulator and a conductive layer on the first light transmissive insulator;
a second light transmissive substrate having a second light transmissive insulator, disposed with a gap from the first light transmissive substrate;
a light emitting diode having a light emitting diode body, and first and second electrodes, the first electrode electrically connecting the light emitting diode body to the conductive layer via a conductive bump, the light emitting diode is located between the first light transmissive substrate and the second light transmissive substrate; and
a third light transmissive insulator formed in a space between the first light transmissive substrate and the second light transmissive substrate;
wherein a height of the conductive bump is equal to or higher than 20 μm and equal to or lower than 50 μm, and
a ratio between a distance from a surface of the light emitting diode to a top of the conductive bump, and, a distance from a center of the conductive bump to a most distant end of the light emitting diode is equal to or larger than 0.12 and equal to or smaller than 0.40.

28. The flexible light emitting device according to claim 27,
wherein the height of the conductive bump is equal to or higher than 30 μm.

29. The flexible light emitting device according to claim 27,
wherein the flexible light emitting device exhibits a light emitting condition is maintained in a flex resistance test, when the flexible light emitting device in a lighting state is wound about a circular cylinder having a 50 mm radius.

30. The flexible light emitting device according to claim 28,
wherein the flexible light emitting device exhibits a flexural test in terms of a lighting maintaining rate at least 6/6 at a bending radius of 20 mm , when the flexible light emitting device in a lighting state is wound about a circular cylinder a specified bending radius.

31. The flexible light emitting device according to claim 27,
wherein the first light transmissive substrate in contact with the third light transmissive insulator is formed in a curved shape inwardly from a part where the light emitting diode is laid out and toward a middle portion between an adjoining light emitting diode.

32. The flexible light emitting device according to claim 27,
wherein the third light transmissive insulator has a thinner thickness than a height of the light emitting diode.

33. The flexible light emitting device according to claim 31,
wherein the third light transmissive insulator is filled among the conductive layer, a side surface of the conductive bump and an upper surface of the light emitting diode body.

34. The flexible light emitting device according to claim 31, wherein the conductive layer is concaved along the conductive bump.

* * * * *